United States Patent [19]
Nakahata et al.

[11] Patent Number: 5,446,329
[45] Date of Patent: Aug. 29, 1995

[54] SURFACE ACOUSTIC WAVE ELEMENT

[75] Inventors: Hideaki Nakahata; Akihiro Hachigo; Kenjiro Higaki; Shinichi Shikata, all of Hyogo, Japan

[73] Assignee: Sumitomo Electric Undustries, Ltd., Osaka, Japan

[21] Appl. No.: 118,976

[22] Filed: Sep. 9, 1993

[30] Foreign Application Priority Data

Sep. 14, 1992 [JP] Japan .................. 4-244906
Sep. 7, 1993 [JP] Japan .................. 5-222475

[51] Int. Cl.$^6$ .................................. H01L 41/08
[52] U.S. Cl. .................. 310/313 A; 310/313 R
[58] Field of Search .............. 310/313 A, 313 R; 333/155, 195, 196

[56] References Cited

U.S. PATENT DOCUMENTS

| | | | |
|---|---|---|---|
| 3,965,444 | 6/1976 | Willingham et al. | 310/313 A X |
| 4,223,286 | 9/1980 | Ono et al. | 333/195 |
| 4,243,960 | 1/1981 | White et al. | 333/196 |
| 4,342,012 | 7/1982 | Inaba et al. | 333/155 |
| 4,345,176 | 8/1982 | Grudkowski et al. | 310/313 A |
| 4,354,130 | 10/1982 | Onoi et al. | 310/313 A |
| 4,484,098 | 11/1984 | Cullen et al. | 310/313 A |
| 4,952,832 | 8/1990 | Imai et al. | 310/313 A |
| 5,086,549 | 2/1992 | Gualtieri | 310/313 A |
| 5,160,869 | 11/1992 | Nakahata et al. | 310/313 A |
| 5,172,024 | 12/1992 | Broussoux et al. | 310/313 A |
| 5,221,870 | 6/1993 | Nakahata et al. | 310/313 A |
| 5,235,233 | 8/1993 | Yamamoto | 310/313 A |
| 5,270,298 | 12/1993 | Ramesh | 310/313 R |
| 5,294,858 | 3/1994 | Nakahata et al. | 310/313 A |

FOREIGN PATENT DOCUMENTS

| | | | |
|---|---|---|---|
| 0034351 | 8/1981 | European Pat. Off. | 310/313 R |
| 0363495 | 9/1989 | European Pat. Off. | |
| 4132309 | 4/1993 | Germany | |
| 54-38874 | 3/1979 | Japan | |
| 0149019 | 11/1981 | Japan | 310/313 R |
| 0149813 | 11/1981 | Japan | 310/313 R |
| 58-91100 | 5/1983 | Japan | |
| 58-135117 | 8/1983 | Japan | |
| 0041315 | 3/1985 | Japan | 310/313 R |
| 0090416 | 5/1985 | Japan | 310/313 R |
| 64-62911 | 3/1989 | Japan | |
| 1-103310 | 4/1989 | Japan | |
| 3-198412 | 8/1991 | Japan | |
| 4132920 | 5/1992 | Japan | |
| 590874 | 4/1993 | Japan | |

OTHER PUBLICATIONS

Study on High Frequency SAW Filter of (ZnO/Diamond/Si) Structure (pp. 271&272).
High Frequency Bandpass Filter Using Polycrystalline Diamond by Shikata et al. Diamond and Related Materials 1993, pp. 1197 to 1202.
"Diamond-Like Thin Films" by Akio Hiraki et al.; Faculty of Engineering, Osaka University, Japan; pp. 41-49.
SiO$_2$/36°Y-X LiTaO$_3$ Surface Acoustic Wave Resonator by K. Satoh et al. 10th Symposium on Ultrasonic Electronics, Tokyo, 1989, pp. 157-158 Jap. Journal of Applied Physics, Vo. 29, Supplement 29-1.

*Primary Examiner*—Mark O. Budd
*Attorney, Agent, or Firm*—W. G. Fasse; W. F. Fasse

[57] ABSTRACT

A surface acoustic wave element includes a hard layer containing a composition component essentially consisting of at least one of diamond and a diamond-like carbon film, a piezoelectric layer formed on the hard layer, a silicon dioxide (SiO$_2$) layer formed on the piezoelectric layer, and electrodes combined with the piezoelectric layer to perform electro-mechanical conversion. The surface acoustic wave element has a larger electro-mechanical coupling coefficient and a higher surface acoustic wave propagation velocity than does a conventional surface acoustic wave element having no silicon dioxide layer, thereby obtaining a surface acoustic wave element that can operate in a high-frequency range. In particular, the electro-mechanical coupling coefficient is increased. The SiO$_2$ layer is an electric insulator and rarely reacts with moisture or acids. The SiO$_2$ layer protects the piezoelectric layer and the electrodes from effects of the external environment, thereby providing a surface acoustic wave element having good high-frequency characteristics and a high resistance to adverse environments.

15 Claims, 16 Drawing Sheets

SURFACE ACOUSTIC WAVE ELEMENT

CROSS-REFERENCE TO RELATED APPLICATION

The present application is related to our application U.S. Ser. No. 08/188,536, filed on Jan. 27, 1994, the entirety of which is incorporated herein by reference.

BACKGROUND OF THE INVENTION

1. Field of the Invention

The present invention relates to a surface acoustic wave element that is operated in a high-frequency range including several hundreds of MHz to GHz and that has a high resistance to effects of the environment. More particularly the invention relates to the structure of the surface acoustic wave element.

2. Related Background Information

A surface acoustic wave element is an electro-mechanical conversion element utilizing a surface wave propagating on the surface of an elastic body and has a basic structure shown in FIG. 14. In a surface acoustic wave element 40 shown in FIG. 14, the piezoelectric phenomenon of a piezoelectric body 44 is used in exciting a surface acoustic wave. When an electrical signal is applied to one comb-like electrode 43 formed on the piezoelectric body 44, the piezoelectric body 44 is stressed, and this stress becomes a surface acoustic wave. The surface acoustic wave propagates on the piezoelectric body 44 and is extracted as an electrical signal at the other comb-like electrode 43'. The frequency characteristics of the surface acoustic wave element are given as band passing characteristics having, as a center frequency, a frequency $f_0$ proportional to a ratio $V/\lambda_0$, which is a ratio of a propagation speed V of the surface acoustic wave to a pitch period $\lambda_0$ of the segments of each comb-like electrode.

A surface acoustic wave element requires a smaller number of parts and can be made compact. In addition, signals can be easily input and output on a surface acoustic wave propagation path. This element can be used in a variety of applications, for example functioning as a filter, a delay line, an oscillator, a resonator, a convolver, or a correlator. In particular, a surface acoustic wave filter has been used as an IF television filter. Such surface acoustic wave filters have also been used in VTRs and as filters in various communication equipment such as mobile and portable telephones.

A typical conventional surface acoustic filter is an element having a structure in which comb-like electrodes are formed on a crystalline piezoelectric material such as LiNbO$_3$ or LiTaO$_3$. Another surface acoustic wave element has a piezoelectric thin film made of ZnO or the like sputtered on a substrate such as a glass substrate.

It is, however, difficult to manufacture an element operated in a high-frequency (Ghz band) range using the conventional element structure described above. An element obtained by forming comb-like electrodes on a monocrystalline piezoelectric body cannot have a high center frequency of 1 Ghz or more because it has a low surface acoustic wave propagation speed V.

As indicated by the above equation, in order to cause a surface acoustic wave element to have band passing characteristics with a higher center frequency, the pitch period $\lambda_0$ must be reduced, or the surface acoustic wave propagation speed V must be increased.

Increasing the center frequency by decreasing the electrode pitch period $\lambda_0$ of the comb-like electrode is limited by micropatterning techniques such as photolithography.

For this reason, various techniques for increasing the propagation speed V of the surface acoustic wave have been examined. Such known techniques are disclosed in Japanese Patent Laid-Open Nos. 54-38874, 64-62911, 1-103310, and 3-198412.

A surface acoustic wave element used as a filter in the fields of mobile communications is required to be used at a higher frequency of 1.5 to 3 Ghz in accordance with the assignment of frequencies. To realize such a filter, an element structure capable of highly efficiently performing electro-mechanical conversion and having a higher surface acoustic wave propagation speed V is required.

It has been considered to use a surface acoustic wave element as a high-frequency filter particularly in a portable telephone or the like. As is well known, components incorporated in this telephone are adversely affected by humidity and impurities because the portable telephone is used in various environments. Therefore, the surface acoustic wave element used in the portable telephone must always maintain stable characteristics in various application environments.

The present invention has been made in consideration of these conventional technical problems, and has as its object to provide a surface acoustic wave element which can be used in a high-frequency range and can maintain stable performance in various external environments, i.e. is highly resistant to environmental effects.

SUMMARY OF THE INVENTION

In order to achieve the above object of the present invention, a surface acoustic wave element according to the present invention has a structure comprising a hard layer containing a composition component essentially consisting of at least one of diamond and a diamond-like carbon film, a piezoelectric layer formed on the hard layer, a silicon dioxide (SiO$_2$) layer formed on the piezoelectric layer, and electrodes combined with the piezoelectric layer to perform electro-mechanical conversion.

As will be described with reference to a preferred embodiment of the present invention, in a surface acoustic wave element has a piezoelectric layer and comb-like electrodes sandwiched between the layer essentially consisting of at least one of diamond and a diamond-like carbon film and the silicon dioxide (SiO$_2$) layer. When the thicknesses of the piezoelectric and SiO$_2$ layers are appropriately set, an electro-mechanical coupling coefficient and a surface acoustic wave propagation speed, and particularly, the electro-mechanical coupling coefficient can be increased as compared with a case in which the SiO$_2$ layer is not formed. That is, according to the present invention, there is provided a surface acoustic wave element that can perform electro-mechanical conversion with a higher efficiency than that of a conventional surface acoustic wave element having no silicon dioxide that layer and has a higher center frequency.

In the surface acoustic wave element, the SiO$_2$ layer is formed on the piezoelectric layer and the comb-like electrodes. Silicon dioxide is an electric insulator and rarely reacts with moisture and an acid. For this reason, the SiO$_2$ layer serves as a passivation layer for protecting the main part of the element, which has the piezoelectric layer and the comb-like electrodes, from the external environment. The influences of humidity and impurities from the external environment can be minimized.

The sign of the change of the change of the surface acoustic wave propagation speed as a function of the temperature of the material constituting the $SiO_2$ layer is opposite the sign of the coefficient of the change of the surface acoustic wave propagation speed as a function of the temperatures of the material constituting the hard layer containing a composition component essentially consisting of at least one of diamond and a diamond-like carbon layer and the material constituting the piezoelectric layer. When the temperature is increased, the surface acoustic wave propagation speed in the $SiO_2$ layer is increased, while the surface acoustic wave propagation speed in the hard layer containing the composition component essentially consisting of at least one of diamond and a diamond-like carbon film and the piezoelectric layer tends to be decreased.

In the surface acoustic wave element according to the present invention, when the $SiO_2$ layer consisting of the material having the change coefficient with an opposite sign is stacked on the hard layer containing a composition component essentially consisting of at least one of diamond and the diamond-like carbon film and the piezoelectric layer, a canceling effect is obtained. Therefore, characteristic variations of the element due to changes in temperature, and particularly, variations in surface acoustic wave propagation speed can be minimized.

According to the present invention, there is provided a surface acoustic wave element that has a high electromechanical conversion efficiency in a higher-frequency range and has stable characteristics.

The present invention can be more fully understood from the detailed description given below and the accompanying drawings, which are by way of illustration only, and thus are not to be considered as limiting the present invention.

The applicability of the present invention will become apparent from the detailed description given hereinafter. However, it should be understood that the detailed description and specific examples, while indicating preferred embodiments of the invention, are for illustration only, since various changes and modifications within the spirit and scope of the invention will become apparent to those skilled in the art from this detailed description.

DETAILED DESCRIPTION OF THE PREFERRED EMBODIMENTS

Figure 1:
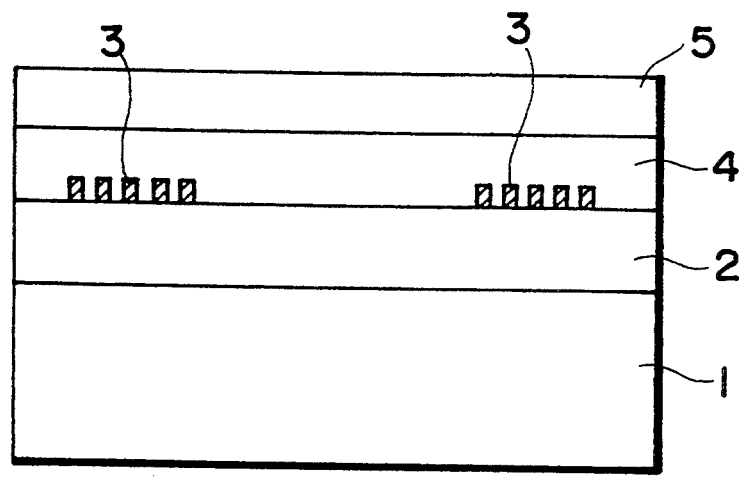
FIG. 1 is a sectional view showing the structure of a surface acoustic wave element according to the first embodiment of the present invention.

Before a detailed description of preferred embodiments is presented, the general structural features, operation, and effect of a surface acoustic wave element according to the present invention will be described in the following.

A surface acoustic wave element according to the present invention has a structure comprising a hard layer essentially consisting of diamond, a piezoelectric layer formed on the hard layer, a silicon dioxide layer formed on the piezoelectric layer, and an electrode group sandwiched between the hard layer and the piezoelectric layer or between the piezoelectric layer and the silicon dioxide layer, for performing electromechanical conversion.

As described above, the piezoelectric layer is sandwiched between the hard layer containing a composition component essentially consisting of diamond or a diamond-like carbon film and the silicon dioxide (SiO$_2$) layer. The main part of the element that comprises the piezoelectric layer and the electrodes can be protected, and a high electro-mechanical coupling level can be obtained.

According to the present invention, the SiO$_2$ layer can be grown by, e.g. a sputtering method, an ion plating method, a CVD method, an electron beam deposition method, or a low-temperature CVD method. The SiO$_2$ may be crystalline or amorphous.

According to the present invention, the diamond-like carbon film consists of diamond-like carbon called i-carbon. The diamond-like carbon film is found in the process of studies on epitaxial synthesis of diamond. The physical properties of the i-carbon have been examined and clarified by many researchers. Although no theory exists that defines the diamond-line carbon film as one material, this film is apparently different from diamond, graphite, or amorphous carbon and has the following properties.

(1) The diamond-like carbon is a composition consisting of carbon and hydrogen and has a smaller number of hydrogen atoms than of carbon atoms.
(2) The crystalline state of the diamond-like carbon is amorphous.
(3) The diamond-like carbon has a greater hardness value than that of at least a general metal.
(4) The diamond-like carbon is an electric insulator.
(5) The diamond-like carbon transmits light therethrough.

Diamond has a hardness value of 10,000 (Hv), while the diamond-like carbon film has a hardness value of 1,000 to 5,000 (Hv).

The diamond-like carbon film is manufactured by an epitaxial process such as plasma CVD, ion beam deposition, or sputtering as in diamond synthesis.

According to the present invention, the layer containing at least diamond or a diamond-like carbon film may contain a small amount of impurity. A hard layer consisting of diamond is preferably used because of a higher surface acoustic wave propagation velocity and a higher electro-mechanical conversion efficiency. That is, the hard layer must contain a composition component essentially consisting of diamond.

On the other hand, the diamond-like carbon film can be epitaxially synthesized even at room temperature, while diamond requires a synthesis temperature of 500° C. or more. For this reason, the diamond-like carbon film makes it possible to widen the selection of a substrate on which the diamond-like carbon film is to be formed. A diamond-like carbon film having a large area can be easily formed and has a smoother surface than that of diamond.

According to the present invention, the hard layer containing the composition component essentially consisting of at least one of diamond and the diamond-like carbon film may consist of natural monocrystalline diamond or monocrystalline diamond synthesized at a very high pressure. Alternatively, the hard layer may be a diamond thin film formed on a substrate or a diamond-like carbon film.

The thickness of the hard layer essentially consisting of at least one of diamond and the diamond-like carbon film is 2 $\pi Hd/\lambda > 3$ and, more preferably 2 $\pi Hd/\lambda > 4$, as will be described in the following embodiments. The substrate on which the diamond thin film is to be formed is not limited to a specific one, but may consist of a semiconductor material (e.g., Si, Mo, W, GaAs, or LiNbO$_3$) or an inorganic material.

Regarding the substrate on which the diamond-like carbon film, is to be formed, it is possible to select a substrate in a wider range than that for diamond. Such a substrate includes a substrate consisting of an organic compound such as a synthetic resin.

The diamond thin film formed on the substrate may be monocrystalline or polycrystalline diamond. The diamond thin film formed by epitaxial synthesis generally has a polycrystalline structure.

A method of forming a diamond thin film on a substrate can be exemplified by a CVD method (e.g., a thermal CVD method, a plasma CVD method, a microwave CVD method, a photo-CVD method, or a laser CVD method), sputtering, and ion beam deposition. The diamond-like carbon film may be formed on a substrate using the same method as in formation of the diamond thin film.

A method of decomposing and exciting a source gas to grow a diamond thin film in accordance with an epitaxial synthesis method may be any one of the following:

(1) heating a thermoelectron radiant material to a temperature of 1,500K or more to activate a source gas;
(2) using discharge generated by a DC, RF, or microwave electric field;
(3) using ion bombardment;
(4) using irradiating light such as a laser beam; or
(5) causing combustion of a source gas.

A source material used to epitaxially synthesize a diamond thin film and a diamond-like carbon film is generally a carbon-containing compound and is preferably used in combination with hydrogen gas. An oxygen-containing compound and/or an inert gas may be added to the source gas, as needed.

Examples of the carbon-containing compound are a paraffin-based hydrocarbon (e.g., methane, ethane, propane, or butane), an olefin-based hydrocarbon (e.g., ethylene, propylene, or butylene), an acetylene-based hydrocarbon (e.g., acetylene or allylene), a diolefin-based hydrocarbon (e.g., butadiene), an alicyclic hydrocarbon (e.g., cyclopropane, cyclobutane, cyclopentane, or cyclohexane), an aromatic hydrocarbon. (e.g., cyclobutadiene, benzene, toluene, or cyclohexane), ketones (e.g., acetone, diethyl ketone, and benzophenone), alcohols (e.g., methanol and ethanol), amines (trimethylamine and triethylamine), carbon dioxide gas, and carbon monoxide. These materials can be used singly or in a combination of at least two materials. Alternatively, the carbon-containing compound may be a material consisting of only carbon atoms, such as graphite, coal, or coke.

As the oxygen-containing compound added to the source gas, oxygen, water, carbon monoxide, carbon dioxide, or hydrogen peroxide is preferable because it is easily accessible.

Examples of the inert gas which can be added to the source gas are argon, helium, neon, krypton, xenon, and radon.

The hard layer containing a composition component essentially consisting of at least one of diamond and a diamond-like carbon film may comprise a substrate essentially consisting of monocrystalline diamond. The monocrystalline diamond substrate is preferably used to increase the surface acoustic wave propagation velocity and the electro-mechanical coupling coefficient. For example, such a substrate may consist of natural diamond or synthetic diamond synthesized at a very high pressure.

According to the present invention, the piezoelectric layer essentially consists of a piezoelectric material such as ZnO, AlN, $Pb(Zr,Ti)O_3$, $(Pb,La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe, or CdS.

The piezoelectric layer may consist of a monocrystalline or polycrystalline piezoelectric material. A surface acoustic wave element to be used in a high-frequency range has a piezoelectric layer preferably consisting of a monocrystalline material in which a surface acoustic wave is scattered less than that of a polycrystalline material. A piezoelectric layer essentially consisting of ZnO, AlN, or $Pb(Zr,Ti)O_3$ may be formed by CVD or sputtering.

According to the present invention, the electrode which performs the electro-mechanical conversion, i.e., conversion between an electrical signal and a surface acoustic wave, is typically a comb-like electrode or an interdigital transducer (IDT) electrode.

The comb-like electrode can be manufactured to have an electrode pitch period of about 1.2 μm using the state-of-the-art photolithographic technique. A material for forming the electrode is preferably a metal having a low resistivity and is exemplified by a metal (e.g., Au, Ag, or Al) which can be deposited at a low temperature, and a refractory metal (e.g., Ti, W, or Mo). Al and Ti are preferably used to facilitate the formation of the electrodes. W and Mo are preferably used to improve the adhesion properties with diamond. The comb-like electrode may be made of a single metal material or a combination of two or more metal materials, for example in that Al is stacked on Ti.

The process for forming a comb-like electrode will be described below. A metal layer selectively consisting of the above materials is formed at a predetermined location. A resist film is formed on the metal layer, a mask having a comb-like electrode pattern formed on a transparent flat plate such as a glass plate is placed above the resist film, and the resist film is exposed with a mercury lamp. The exposed resist film is developed to obtain a resist pattern. The resist pattern may be formed using a method of directly sensitizing a resist film with an electron beam instead of the above-mentioned method.

After the resist pattern is formed, the metal layer is patterned into a predetermined shape by etching. To etch a layer consisting of a low-melting metal such as Al, an alkaline solution such as a sodium hydroxide solution or an acidic solution such as a nitric acid solution is used. On the other hand, to etch a refractory metal, a solution mixture of hydrofluoric acid and nitric acid is used. Reactive ion etching using a gas such as $BCl_3$ may be used to etch the metal layer.

According to the present invention, the electrode may also be formed of electrically conductive diamond. The conductive diamond may be formed by a method of epitaxially growing diamond while doping with an impurity such as P, Al, or S, a method of doping such an impurity into insulating diamond by ion implantation, a method of radiating insulating diamond with an electron beam to introduce lattice defects, or a method of hydrogenating insulating diamond.

According to the present invention, the comb-like electrodes can be formed between the piezoelectric layer and the layer essentially consisting of at least one of diamond and a diamond-like carbon film or between the piezoelectric layer and the silicon dioxide ($SiO_2$) layer. In addition, the comb-like electrodes may be formed together with short-circuiting electrodes.

When the comb-like electrodes are formed between the piezoelectric layer and the layer essentially consisting of at least one of diamond and a diamond-like carbon film, the short-circuiting electrodes may be formed between the piezoelectric layer and the $SiO_2$ layer and/or on the $SiO_2$ layer.

When the comb-like electrodes are formed between the piezoelectric layer and the $SiO_2$ layer, the short-circuiting electrodes can be formed between the piezoelectric layer and the layer essentially consisting of at least one of diamond and the diamond-like carbon film and/or on the $SiO_2$ layer.

Figure 12:
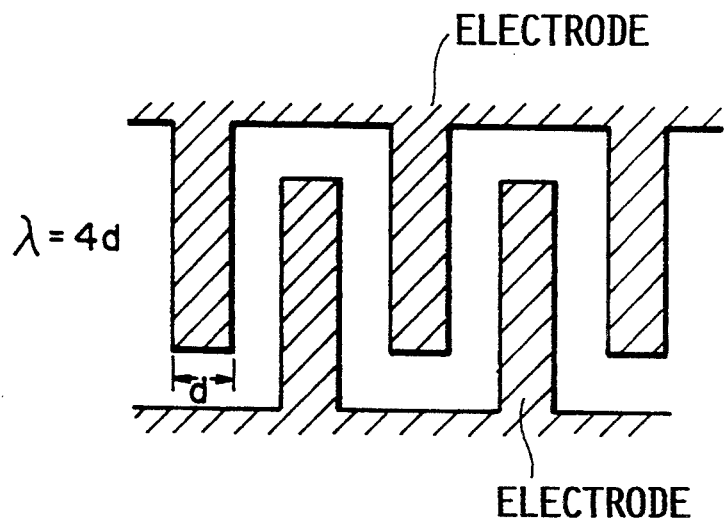
FIGS. 12 and 13 are plan views showing the shapes of comb-like electrodes according to the embodiments.
Figure 13:
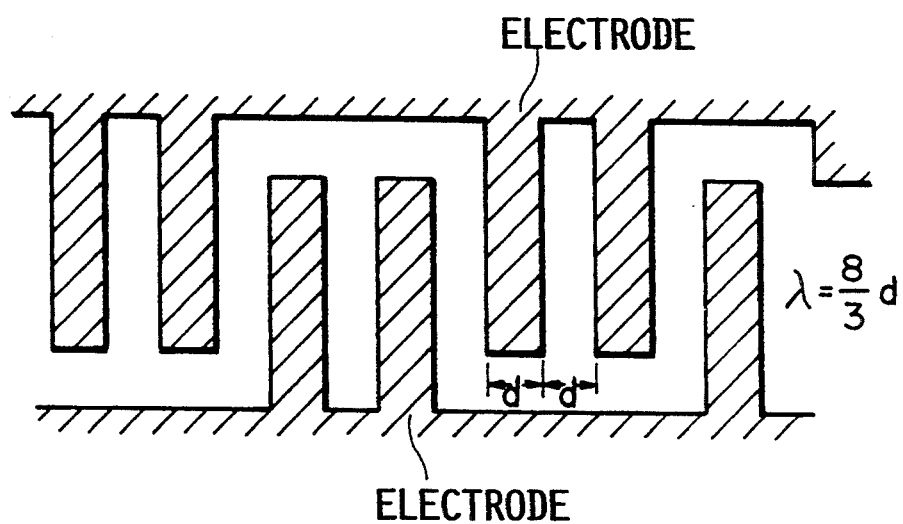
Figure 14:
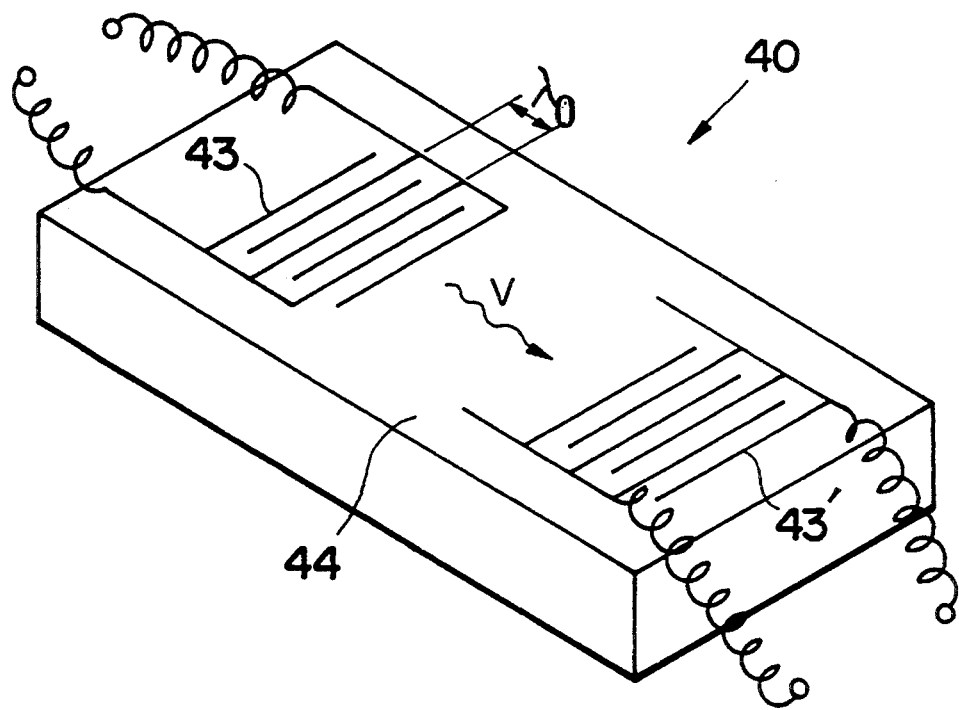
FIG. 14 is a perspective view showing the basic structure of a surface acoustic wave element.

The comb-like electrodes have a shape shown in FIG. 12 or 13.

In a surface acoustic wave element in which a piezoelectric layer is formed on the substrate, when the sound velocity of a substrate material is higher than that of the piezoelectric material, a plurality of surface acoustic waves having different propagation velocities are excited. In this case, the excitation modes are defined as a 0th-order mode, a first-order mode, a second-order mode, a third-order mode, etc. in ascending order of propagation velocity.

A surface acoustic wave element according to the present invention can be used as, for example, an element using the first-order more. According to the present invention, there can be provided a surface acoustic wave element in which the propagation velocity in the first-order mode is about 8,000 m/s or more and the electro-mechanical coupling coefficient is 3% or more. In this case, the electro-mechanical coupling coefficient is an index representing conversion efficiency in conversion of electrical energy into mechanical energy.

A conventional surface acoustic wave element in some respects similar to that of the present invention, having a structure in which a silicon dioxide ($SiO_2$) layer is deposited on an $LiTaO_3$ layer, has been found to have an electro-mechanical coupling coefficient as large as 5.2% when the thickness of the $SiO_2$ layer is 2 $\pi Hs/\lambda = 1.3$ (Jpn. J. Appl. Phys. Suppl. No. 29-1, pp. 157–158, 1990, SATOH K., FUJIWARA Y., and HASHIMOTO K.)

The surface acoustic wave element according to the present invention has a surface acoustic wave propagation velocity that can be twice that of the above-mentioned conventional surface acoustic wave element and the surface acoustic wave element of the present invention can maintain a large electro-mechanical coupling coefficient.

According to the present invention, to realize such a surface acoustic wave element, the effective ranges of the thicknesses of the layer essentially consisting of at least one of diamond and a diamond-like carbon film, the piezoelectric layer, and the silicon dioxide ($SiO_2$) layer are clearly specified.

As will be described in the following embodiments, in a surface acoustic wave element having a piezoelectric layer and comb-like electrodes sandwiched between a layer essentially consisting of at least one of diamond and a diamond-like carbon film and a SiO$_2$ layer, when the thicknesses of the piezoelectric and SiO$_2$ layers are appropriately set, a surface acoustic wave propagation velocity and especially an electro-mechanical coupling coefficient can be increased according to the present invention as compared with a case in which the SiO$_2$ layer is not formed. That is, according to the present invention, there is provided a surface acoustic wave element that can perform electro-mechanical conversion with a higher efficiency and with a higher center frequency than that of a conventional surface acoustic wave element having no SiO$_2$ layer and which has a higher center frequency.

In the surface acoustic wave element, the dioxide (SiO$_2$) layer is formed on the piezoelectric layer and the comb-like electrodes. Silicon dioxide is an electric insulator and rarely reacts with moisture and acids. For this reason, the SiO$_2$ layer serves as a passivation layer for protecting the main part of the element, which includes the piezoelectric layer and the comb-like electrodes, from the external environment. The influences of humidity and impurities from the external environment can be minimized.

The sign of the coefficient of the change or variation of the surface acoustic wave propagation velocity as a function of the temperature of the material constituting the silicon SiO$_2$ layer is opposite to sign of the coefficient of the change of the surface acoustic wave propagation velocity as a function of the temperatures of the material constituting the hard layer essentially consisting of at least one of diamond and a diamond-like carbon layer and the material constituting the piezoelectric layer. When the temperature is increased, the surface acoustic wave propagation velocity in the SiO$_2$ layer is increased, while the surface acoustic wave propagation velocity in the hard layer containing the composition component essentially consisting of at least one of diamond and a diamond-like carbon film and the piezoelectric layer tends to be decreased.

In the surface acoustic wave element according to the present invention, when the SiO$_2$ layer consisting of the material having the change coefficient with an opposite sign is stacked on the hard layer containing the composition component essentially consisting of at least one of diamond and a diamond-like carbon film and the piezoelectric layer, a canceling effect is obtained. Therefore, characteristic variations of the element due to changes in temperature, and particularly, variations in surface acoustic wave propagation velocity can be minimized.

According to the present invention, there is provided a surface acoustic wave element that has a high electromechanical conversion efficiency in a higher-frequency range and has stable characteristics.

EMBODIMENT 1

An Si substrate having dimensions of 10×10×1 mm was prepared and placed in a plasma CVD apparatus. The reaction chamber of the apparatus was evacuated, and a gas mixture of H$_2$:CH$_4$=200:1 was supplied thereto. Plasma CVD was performed at a vacuum chamber pressure of about 40 Torr, a substrate temperature of 850° C., and a microwave power of 400 W to grow a 25-μm thick diamond thin film on the Si substrate.

The diamond thin film was left out in the normal atmosphere at 450° C. for 10 minutes to increase the resistance of the diamond thin film. After the surface of the diamond thin film was polished, a 500-Å thick Al layer was deposited on the polished surface by a resistance heating method. Using a photolithographic method, the Al layer was etched to form comb-like electrodes each having line widths and spaces of 2 μm. The shape of the comb-like electrodes was identical to that shown in FIG. 12.

Magnetron sputtering was performed for sputtering a polycrystalline ZnO body using a gas mixture of Ar:O$_2$=1:1 at a sputtering output of 150 W and a substrate temperature of 380° C. to deposit a 0.93-μm thick ZnO film.

An amorphous SiO$_2$ film was formed by a sputtering method using an SiO$_2$ target and a gas mixture of Ar:O$_2$=1:1 at a substrate temperature of 150° C., an RF power of 200 W, and a pressure of 0.01 Torr.

FIG. 1 is a sectional view showing a surface acoustic wave element based on Embodiment 1.

As shown in FIG. 1, a diamond thin film 2 is formed on an Si substrate 1. Comb-like electrodes 3 are formed on the diamond thin film 2. A ZnO thin film 4 is formed on the comb-like electrodes 3. An SiO$_2$ film 5 is formed on the ZnO thin film 4.

Figure 2:
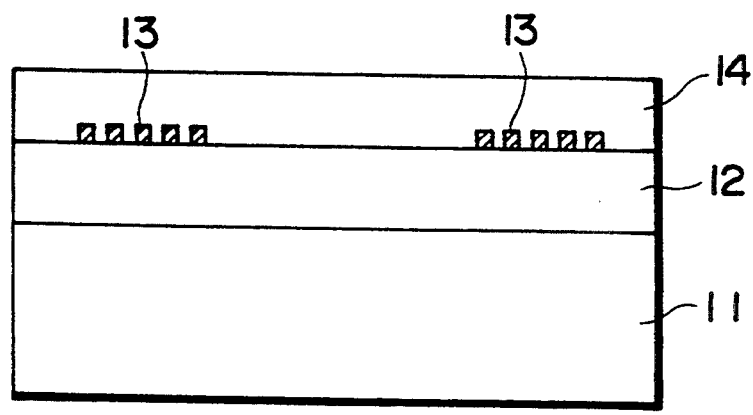
FIG. 2 is a sectional view showing the structure of a conventional surface acoustic wave element manufactured as a comparative example.

To compare the above surface acoustic wave element of Embodiment 1 with a comparative example, the comparative example was prepared as a surface acoustic wave element having no SiO$_2$ film, as shown in FIG. 2.

As shown in FIG. 2, a diamond thin film 12 is formed on an Si substrate 11. Comb-like electrodes 13 are formed on the diamond thin film 12, and an ZnO thin film 14 is formed on the comb-like electrodes 13. The surface acoustic wave element of the comparative example was manufactured following the same procedures as in the surface acoustic wave element based on Embodiment 1, except that the SiO$_2$ film was not formed.

A 5% diluted hydrochloric acid solution was dripped on the surfaces of the surface acoustic wave elements of Embodiment 1 and the comparative example, and filter characteristics were evaluated. As a result, no change was observed in the filter characteristics of the surface acoustic wave element of Embodiment 1 shown in FIG. 1. However, the ZnO thin film 14 was etched in the surface acoustic wave element of the comparative example shown in FIG. 2, and the filter characteristics were lost. In this manner, it was found that the SiO$_2$ film 5 formed on the ZnO thin film 4 protects the surface acoustic wave element from the external environment.

EMBODIMENT 2

Figure 3:
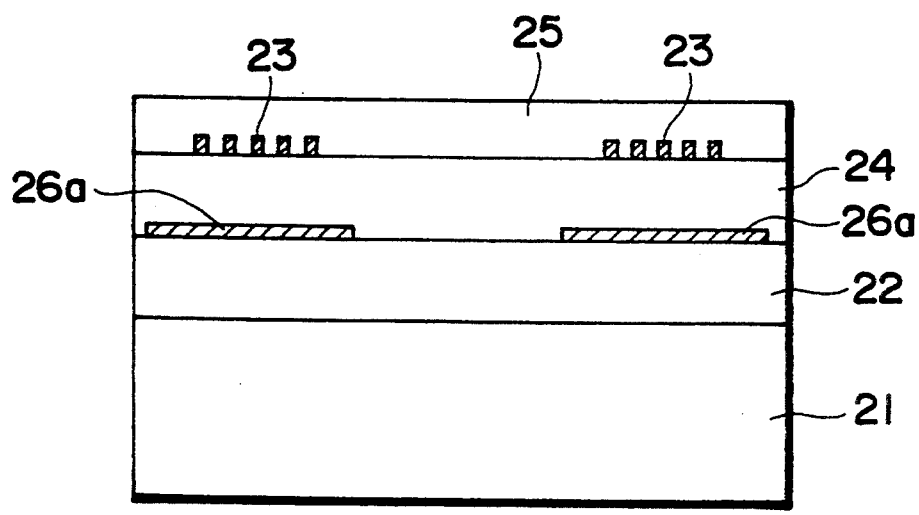
FIG. 3 is a sectional view showing the structure of a surface acoustic wave element according to the second embodiment of the present invention.

An element having a structure shown in FIG. 3 was manufactured. As shown in FIG. 3, a diamond thin film 22 is formed on an Si substrate 21. Short-circuiting electrodes 26a are formed on the diamond thin film 22, and a ZnO thin film 24 is formed on the short-circuiting electrodes 26a. Comb-like electrodes 23 are formed on the ZnO thin film 24, and an SiO$_2$ film 25 is formed on the comb-like electrodes 23.

In the manufacture of the element having the structure shown in FIG. 3, the diamond thin film 22 was formed by a plasma CVD method under the same conditions as the synthesis conditions of Embodiment 1. The thickness of the diamond thin film was about 25 μm. The ZnO thin film 24 and the comb-like electrodes 23 were formed under the same conditions as in Embodiment 1. On the other hand, the short-circuiting electrodes 26a were formed by a photolithographic method after a 500-Å thick Al layer was deposited on the polished surface of the diamond thin film 22 by the resistance heating method. In the element having the structure shown in FIG. 3, the short-circuiting electrodes 26a were formed in a region where the comb-like electrodes 23 were to be formed, so as to improve the excitation efficiency of the element. Various SiO₂ films 25 were formed by the low-temperature CVD method under the same conditions as the synthesis conditions of Embodiment 1 so as to examine element characteristics.

The structure of the surface acoustic wave element shown in FIG. 3 is defined as an A structure. Changes in characteristics upon changes in thicknesses of the SiO₂ film 25 are shown later.

EMBODIMENT 3

Figure 4:
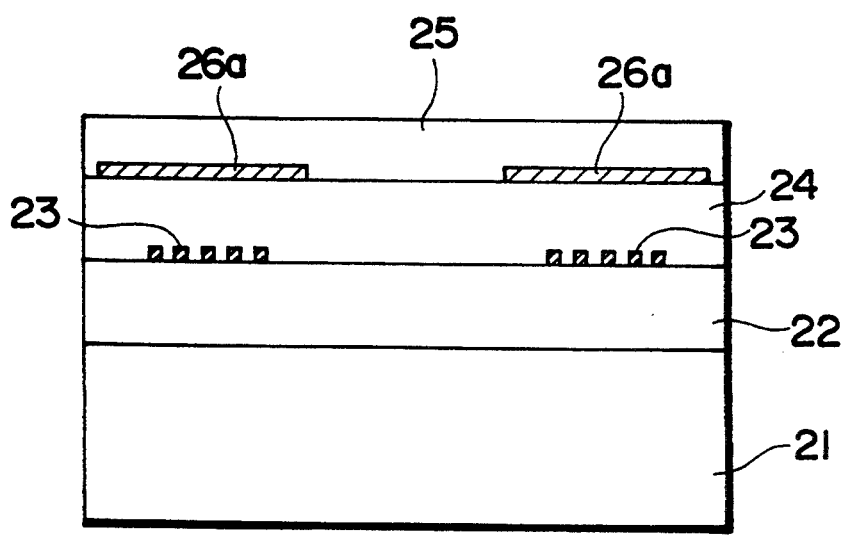
FIG. 4 is a sectional view showing the structure of a surface acoustic wave element according to the third embodiment of the present invention.

An element having a structure shown in FIG. 4 was manufactured. As shown in FIG. 4, a diamond thin film 22 is formed on an Si substrate 21, and comb-like electrodes 23 are formed on the diamond thin film 22. A ZnO thin film 24 is formed to cover the diamond thin film 22 and the comb-like electrodes 23. Short-circuiting electrodes 26a are formed on the ZnO thin film 24, and an SiO₂ film 25 is formed to cover the short-circuiting electrodes 26a.

The element having the structure shown in FIG. 4 was formed under the same conditions as in Embodiments 1 and 2.

The structure of the surface acoustic wave element shown in FIG. 4 is defined as a B structure. Changes in characteristics upon changes in thicknesses of the SiO₂ film 25 are shown later.

EMBODIMENT 4

Figure 5:
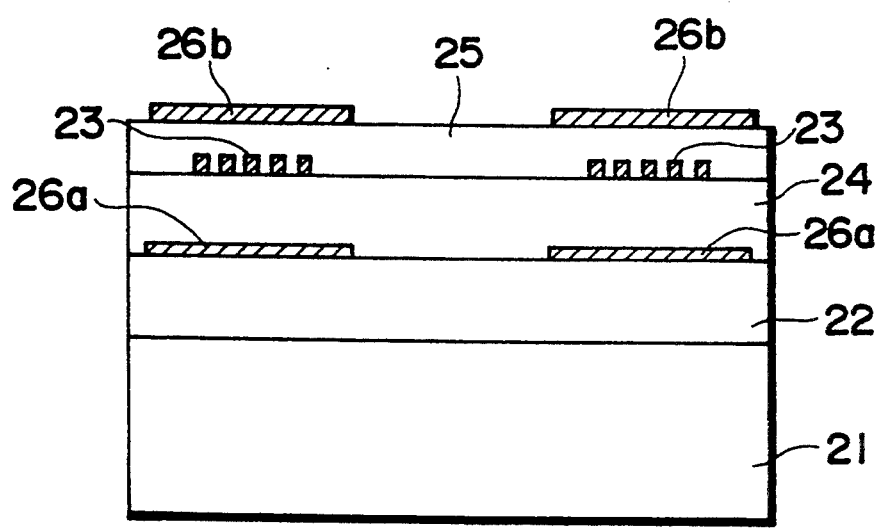
FIG. 5 is a sectional view showing the structure of a surface acoustic wave element according to the fourth embodiment of the present invention.

An element having a structure shown in FIG. 5 was manufactured. As shown in FIG. 5, a diamond thin film 22 is formed on an Si substrate 21. Short-circuiting electrodes 26a are formed on the diamond thin film 22, and a ZnO thin film 24 is formed on the short-circuiting electrodes 26a. Comb-like electrodes 23 are formed on the ZnO thin film 24, and an SiO₂ film 25 is formed on the comb-like electrodes 23. Short-circuiting electrodes 26b are further formed on the SiO₂ film so as to cover a region in which the comb-like electrodes 23 are formed.

The element having the structure shown in FIG. 5 was formed under the same conditions as in Embodiments 1 to 3.

The structure of the surface acoustic wave element shown in FIG. 5 is defined as a C structure. Changes in characteristics upon changes in thicknesses of the SiO₂ film 25 are shown later.

EMBODIMENT 5

Figure 6:
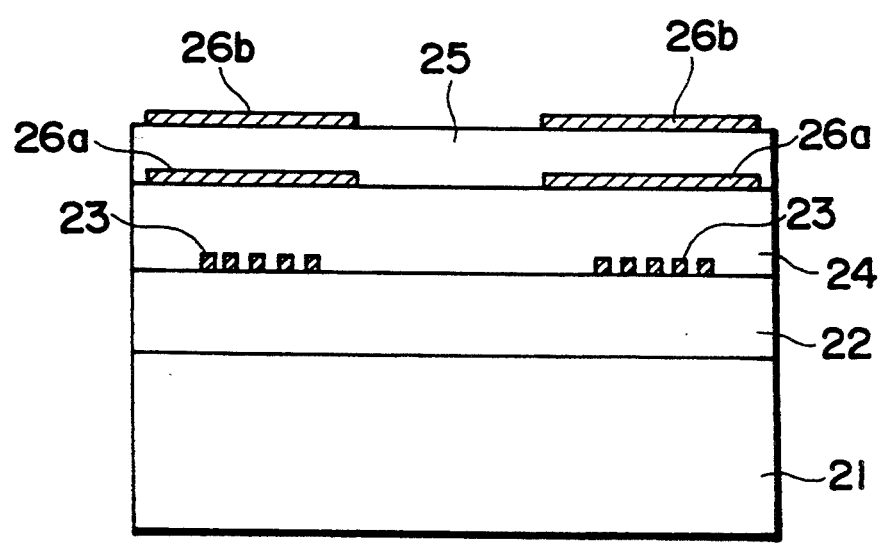
FIG. 6 is a sectional view showing the structure of a surface acoustic wave element according to the fifth embodiment of the present invention.

An element having a structure shown in FIG. 6 was manufactured. As shown in FIG. 6, a diamond thin film 22 is formed on an Si substrate 21. Comb-like electrodes 23 are formed on the diamond thin film 22, and a ZnO thin film 24 is formed on the comb-like electrodes 23. Short-circuiting electrodes 26a are formed on the ZnO thin film 24 so as to cover a region in which comb-like electrodes 23 are formed. An SiO₂ film 25 is formed on the short-circuiting electrodes 26a. Short-circuiting electrodes 26b are formed on the SiO₂ film 25.

The element having the structure shown in FIG. 6 was formed under the same conditions as in Embodiments 1 to 4.

The structure of the surface acoustic wave element shown in FIG. 6 is defined as a D structure. Changes in characteristics upon changes in thicknesses of the SiO₂ film 25 are shown later.

In the surface acoustic wave elements having the A to D structures, the ZnO thin films 24 were defined to have equal thicknesses, and the thicknesses of the SiO₂ films 25 formed as the uppermost layers were changed to measure corresponding electro-mechanical coupling coefficients $K^2$. The changes in electro-mechanical coupling coefficients were plotted as a graph. The following parameters were defined so as to represent the relationship between the thicknesses of the SiO₂ films and the electro-mechanical coupling coefficients $K^2$.

The wavelength of the surface acoustic wave is defined as $\lambda$. To define the thickness of the ZnO thin film as a non-or zero-dimensional parameter, the thickness is expressed as $2\pi Hz/\lambda$ obtained by dividing a film thickness Hz by the wavelength $\lambda$ and multiplying the quotient by $2\pi$. Similarly, to define the thickness of the SiO₂ film as a non-or parameter, the thickness is expressed as $2\pi Hs/\lambda$ obtained by dividing a film thickness Hs by the wavelength $\lambda$ and multiplying the quotient by $2\pi$.

$2\pi Hz/\lambda$ and $2\pi Hs/\lambda$ are used herein because ratios of the film thicknesses Hz and Hs to the wavelength apparently have larger influences on the surface acoustic wave propagation velocity V and the electro-mechanical coupling coefficient $K^2$ than the absolute values of the film thicknesses Hz and Hs.

Figure 7:
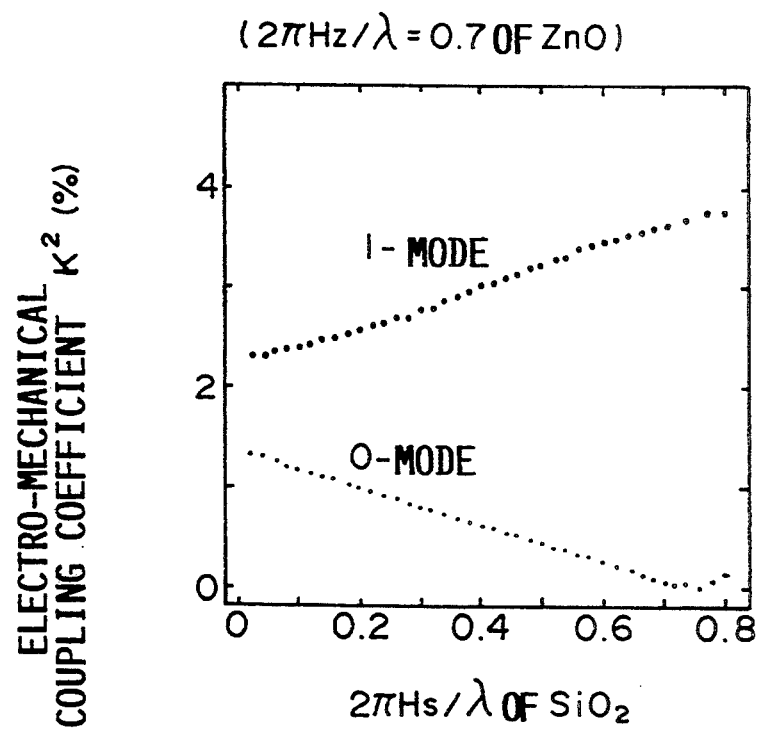
FIG. 7 is a graph showing a relationship between the thickness of an $SiO_2$ film and an electro-mechanical coupling coefficient in the surface acoustic wave element of the second embodiment.

FIG. 7 is a graph showing the relationship between $2\pi Hs/\lambda$ and the electro-mechanical coupling coefficient $K^2$ in the element having the A structure for $2\pi Hz/\lambda = 0.7$.

As shown in FIG. 7, in the element having the A structure, if $2\pi HZ/\lambda = 0.7$ and $2\pi Hs/\lambda = 0.8$, then the electro-mechanical coupling coefficient $K^2$ in the first-order mode can be increased up to about 4%. Judging from the result of FIG. 7, it is found that the electro-mechanical coupling coefficient $K^s$ can be increased by forming the SiO₂ film on the ZnO thin film 24.

In the relationship between the electro-mechanical coupling coefficient $K^2$ and $2\pi Hz/\lambda$, if $2\pi Hz/\lambda$ falls within the range of 0.65 to 0.75, the same tendency as described above can be confirmed.

Figure 8:
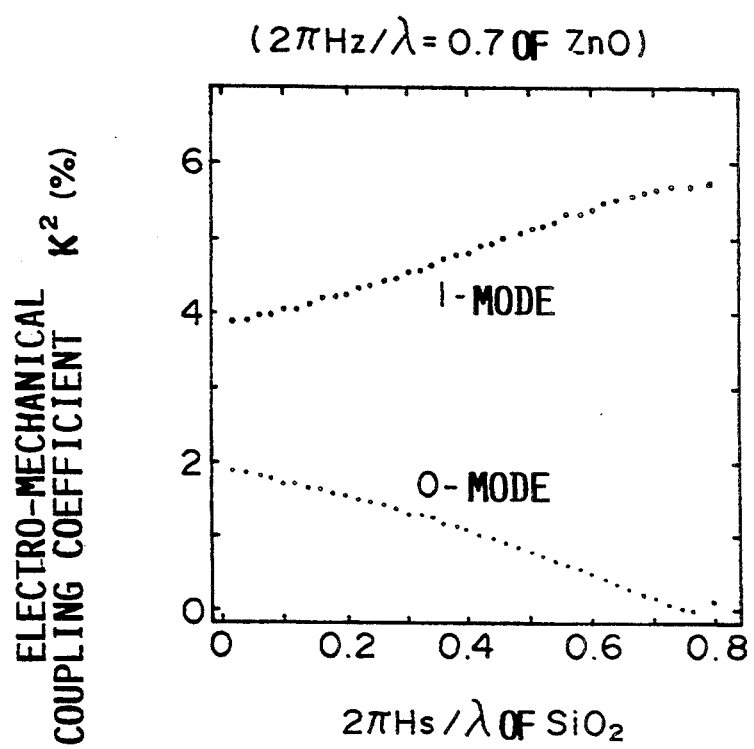
FIG. 8 is a graph showing a relationship between the thickness of an $SiO_2$ film and an electro-mechanical coupling coefficient in the surface acoustic wave element of the third embodiment.

FIG. 8 is a graph showing the relationship between $2\pi Hs/\lambda$ and the electro-mechanical coupling coefficient $K^2$ in the element having the B structure for $2\pi Hz/\lambda = 0.7$.

As shown in FIG. 8, in the element having the B structure, if $2\pi Hz/\lambda = 0.7$ and $2\pi Hs/\lambda = 0.8$, then the electro-mechanical coupling coefficient $K^2$ in the first-order mode can reach about 6%. In this manner, the electro-mechanical coupling coefficient $K^2$ can be increased by 2% as compared with the structure in which an SiO film is not formed ($2\pi Hs/\lambda = 0$).

In the relationship between the electro-mechanical coupling coefficient $K^2$ and $2\pi Hz/\lambda$, if $2\pi Hz/\lambda$ falls within the range of 0.65 to 0.75, the same tendency as described above can be confirmed.

Figure 9:
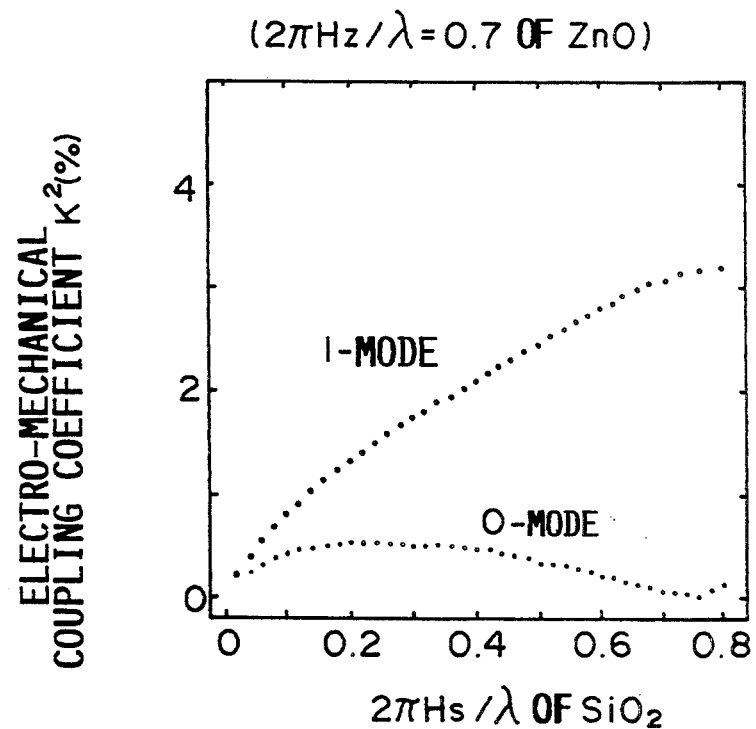
FIG. 9 is a graph showing a relationship between the thickness of an $SiO_2$ film and an electro-mechanical coupling coefficient in the surface acoustic wave element of the fourth embodiment.

FIG. 9 is a graph showing the relationship between $2\pi Hs/\lambda$ and the electro-mechanical coupling coefficient $K^2$ in the element having the C structure for $2\pi Hz/\lambda = 0.7$.

As shown in FIG. 9, in the element having the C structure, if $2\pi Hz/\lambda = 0.7$ and $2\pi Hs/\lambda = 0.8$, then the electro-mechanical coupling coefficient $K^2$ in the first-order mode can reach about 3%. In this manner, the electro-mechanical coupling coefficient $K^2$ can be increased by 3% as compared with the structure in which a $SiO_2$ film is not formed ($2\pi Hs/\lambda = 0$).

In the relationship between the electro-mechanical coupling coefficient $K^2$ and $2\pi Hs/\lambda$, if $2\pi Hz/\lambda$ falls within the range of 0.65 to 0.75, the same tendency as described above can be confirmed.

Figure 10:
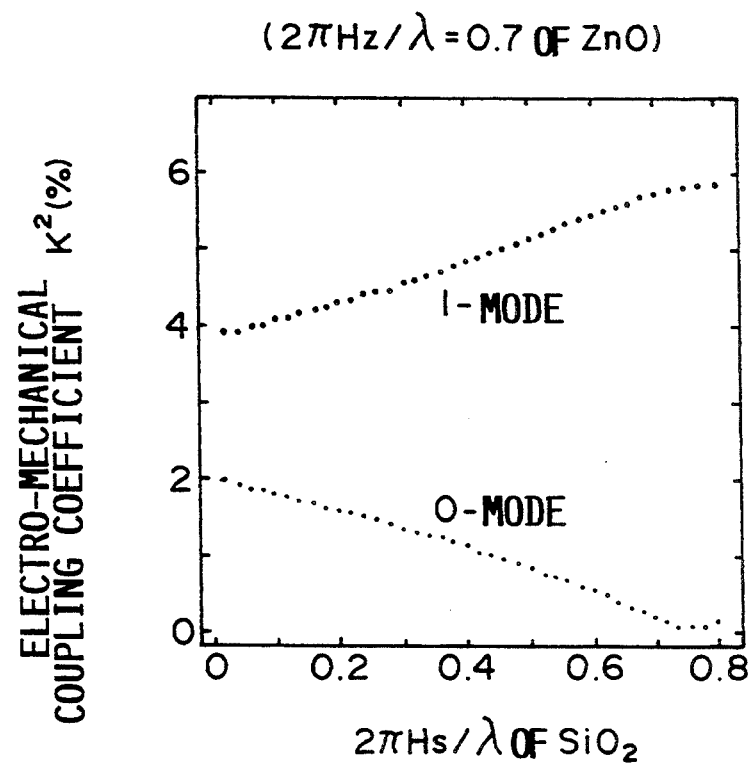
FIG. 10 is a graph showing a relationship between the thickness of an $SiO_2$ film and an electro-mechanical coupling coefficient in the surface acoustic wave element of the fifth embodiment.

FIG. 10 is a graph showing the relationship between $2\pi Hs/\lambda$ and the electro-mechanical coupling coefficient $K^2$ in the element having the D structure for $2\pi Hz/\lambda = 0.7$.

As shown in FIG. 10, in the element having the D structure, if $2\pi Hz/\lambda = 0.7$ and $2\pi Hs/\lambda = 0.8$, then the electro-mechanical coupling coefficient $K^2$ in the first-order mode can reach about 6%. In this manner, the electro-mechanical coupling coefficient $K^2$ can be increased by 2% as compared with the structure in which an $SiO_2$ film is not formed ($2\pi Hs/\lambda = 0$).

In the relationship between the electro-mechanical coupling coefficient $K^2$ and $2\pi Hs/\lambda$, if $2\pi Hz/\lambda$ falls within the range of 0.65 to 0.75, the same tendency as described above can be confirmed.

In each of the elements having the A to D structures described above, the thickness of the diamond thin film 22 formed on the Si substrate was about 25 μm. When a thickness Hd of the diamond thin film 22 is increased, the surface acoustic wave propagation velocity V is increased. However, if $2\pi Hd/\lambda > 4.0$, the surface acoustic wave propagation velocity V is not much increased. Therefore, the diamond thin film 22 is sufficiently thick when it has the thickness Hd satisfying $2\pi Hd/\lambda = 4.0$.

Figure 11:
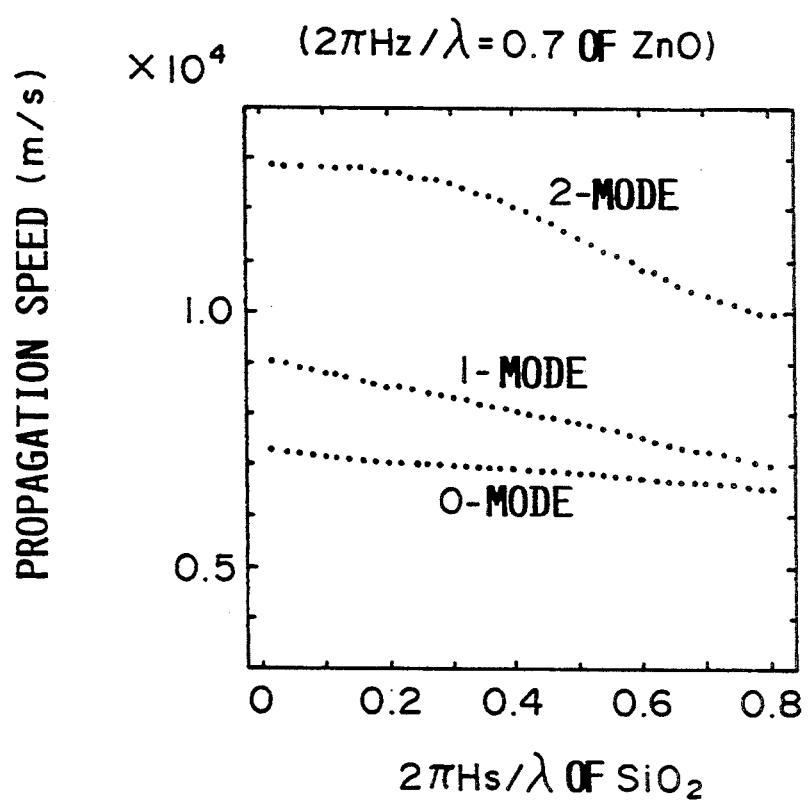
FIG. 11 is a graph showing a relationship between the thicknesses of the $SiO_2$ films and the surface acoustic wave propagation velocity in the surface acoustic wave elements of the second, third, fourth, and fifth embodiments.

The relationships between the surface acoustic wave propagation velocity and $2\pi Hs/\lambda$ in the elements having the A to D structures are shown in FIG. 11.

As shown in FIG. 11, it is apparent that a high propagation velocity is obtained in both the first- and second-order modes. In the first-order mode, when the thickness of the $SiO_2$ film 25 is increased, the propagation velocity is slightly decreased. A sufficiently high propagation velocity of about 8,000 m/s is found to be obtained at $2\pi Hs/\lambda = 0.5$.

As shown in FIGS. 7 to 10, in all the elements having the A, B, C, and D structures, when $2\pi Hs/\lambda$ is increased, the electro-mechanical coupling coefficient in the 0th-order mode is suppressed, i.e. becomes small. Therefore, in these elements, the oscillation of unnecessary waves can be suppressed, and good spurious characteristics can be obtained.

In each of the surface acoustic wave elements shown in Embodiments 1 to 4, when the thickness of the $SiO_2$ film 25 has a $2\pi Hs/\lambda$ value falling within the range of 0.2 to 0.8, the element can be applied as an element having a first-order mode oscillation structure.

EMBODIMENT 6

Figure 15:
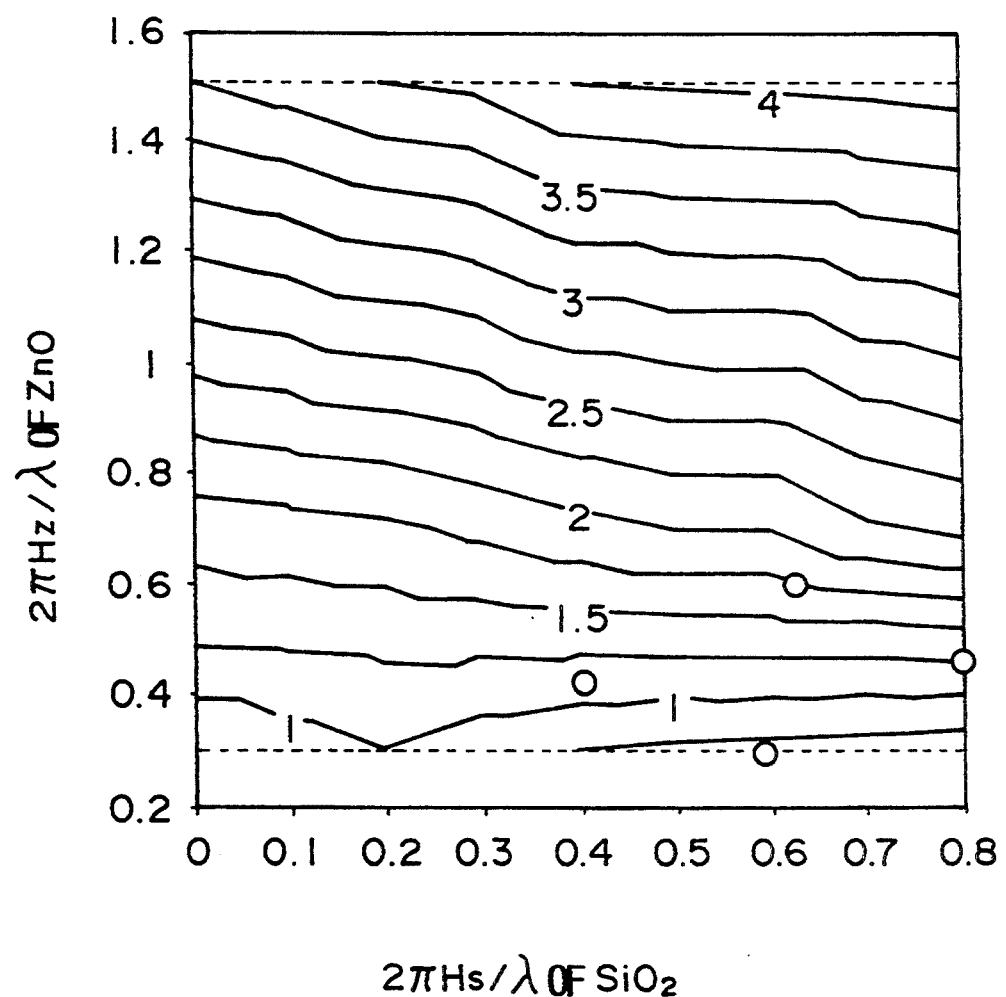
FIG. 15 is a graph showing a relationship between the thicknesses of the $SiO_2$ and ZnO films and the electro-mechanical coefficient in the surface acoustic wave element of the sixth embodiment.

A surface acoustic wave element was manufactured having the same structure as that of the elements shown in FIG. 1 except only that the thickness of the ZnO thin film and the $SiO_2$ thin film was different. In the manufactured element, the structure of the comb-like electrode is the same type as that of the element of FIG. 1, and both the width of the electrodes and the distance between the electrodes are 2 μm. Further, $2\pi Hd/\lambda$ in the diamond layer is set to be 4, and the element was formed under the same conditions as in Embodiments 1 to 5. FIG. 15 shows an estimation result of the characteristics in the manufactured element. FIG. 15 is a graph showing the relationship between $2\pi Hz/\lambda$ and $2\pi Hs/\lambda$ and electro-mechanical coupling coefficient $K^2$. In FIG. 15, a vertical axis and horizontal axis respectively show $2\pi Hz/\lambda$ and $2\pi Hs/\lambda$ and the numbered lines in the graph represent the value of $K^2$.

As shown in FIG. 15, in the element having this structure, the value of electro-mechanical coupling coefficient $K^2$ increases with the increase in the thickness ($2\pi Hz/\lambda$) of the ZnO thin film in spite of the thickness ($2\pi Hs/\lambda$) of the $SiO_2$ thin film. Especially when $2\pi Hs/\lambda \leq 0.8$ and $2\pi Hz/\lambda \geq 1.4$, the surface acoustic wave element having $K^2 = 3.5\%$ can be obtained.

In consideration of the propagation velocity of such a surface acoustic wave element and changes in stability of the element against changes in temperature, a surface acoustic wave element having the ZnO thin film and the $SiO_2$ thin film with thickness corresponding to an area surrounded by 4 circles in FIG. 15 is preferable in practical use. The surface acoustic wave element has a propagation velocity of about 8000–10000 m/s, and a temperature coefficient $\sigma$ of $0\pm 10$ ppm/° C. Thus, in the surface acoustic wave element having the $SiO_2$ according to the present Embodiments, the thicknesses of the ZnO thin film or the $SiO_2$ thin film can be selected to realize good characteristics of the element in actual use.

EMBODIMENT 7

Figure 16:
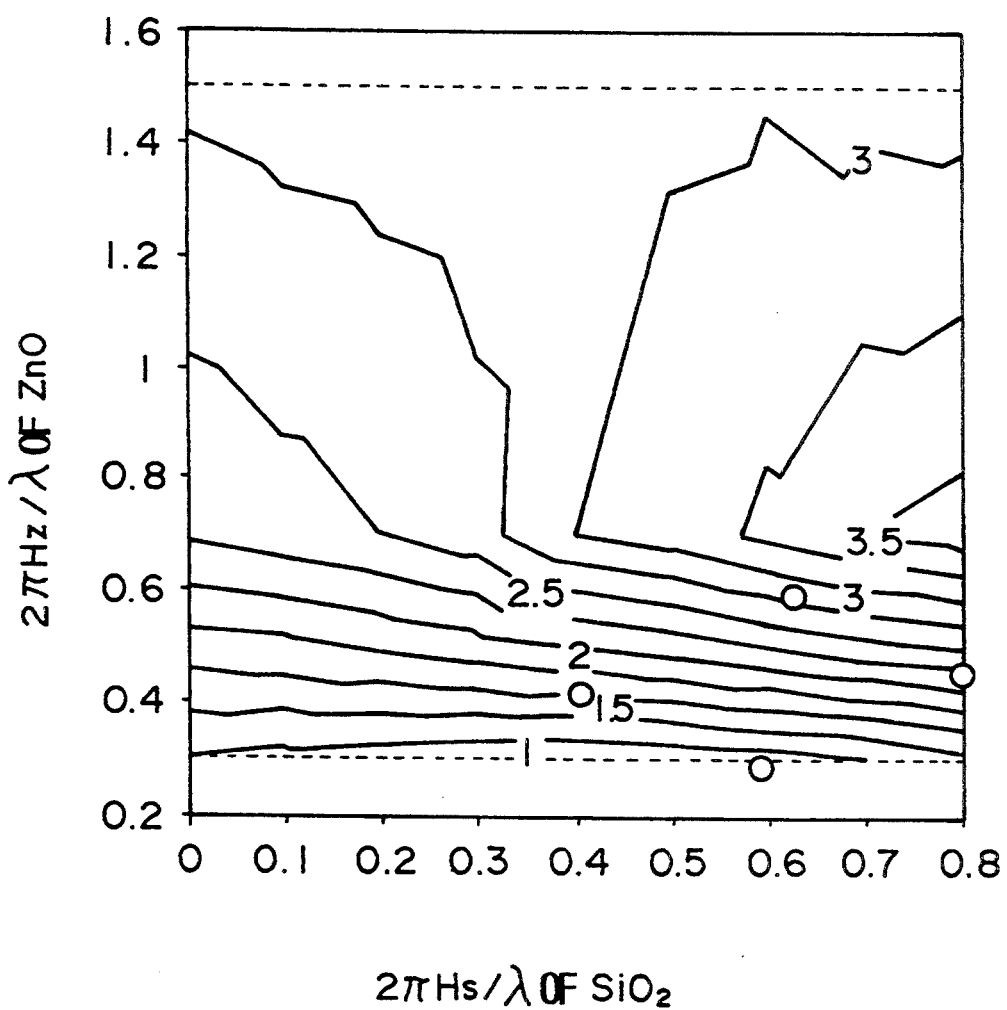
FIG. 16 is a graph showing a relationship between the thicknesses of the $SiO_2$ and ZnO films and the electro-mechanical coefficient in the surface acoustic wave element of the seventh embodiment.

A surface acoustic wave element was manufactured having the same structure as that of the elements shown in FIG. 3 except only that the thickness of the ZnO thin film and the $SiO_2$ thin film was different. In the manufactured element, the structure of the comb-like electrode is the same type as that of the element of FIG. 13, and both the width of the electrodes and the distance between the electrodes are 2 μm. Further, $2\pi Hd/\lambda$ in the diamond layer is set to be 4, and the element was formed under the same conditions as in Embodiments 1 to 5. FIG. 16 shows an estimation result of the characteristics in the manufactured element. FIG. 16 is a graph showing the relationship between $2\pi Hz/\lambda$ and $2\pi Hs/\lambda$ and electro-mechanical coupling coefficient $K^2$. In FIG. 16, a vertical axis and horizontal axis respectively show $2\pi Hz/\lambda$ and $2\pi Hs/\lambda$ and the numbered lines in the graph represent the value of $K^2$.

As shown in FIG. 16, in the element having this structure, the value of electro-mechanical coupling coefficients $K^2$ increases with the increase in the thickness ($2\pi Hz/\lambda$) of the $ZnO_2$ thin film in spite of the thickness ($2\pi Hs/\lambda$) of the $SiO_2$ thin film. Especially when $2\pi Hs/\lambda$ falls within the range of 0.7 to 0.8 and $2\pi Hz/\lambda$ falls within the range of 0.7 to 0.8, the surface acoustic wave element having $K^2 = 4\%$ can be obtained.

In consideration of the propagation velocity of such a surface acoustic wave element and the stability of the element against changes in temperature, a surface acoustic wave element having the ZnO thin film and the $SiO_2$ thin film with thickness corresponding to an area surrounded by 4 circles in FIG. 16 is preferable in practical use. The surface acoustic wave element has a propagation velocity of about 8000–10000 m/s, and a temperature coefficient $\sigma$ of $0\pm 10$ ppm/° C. Thus, in the surface acoustic wave element having the $SiO_2$ according to Embodiment 7, the thicknesses of the ZnO thin film or the $SiO_2$ thin film can be selected to realize good characteristics of the element in actual use.

EMBODIMENT 8

Figure 17:
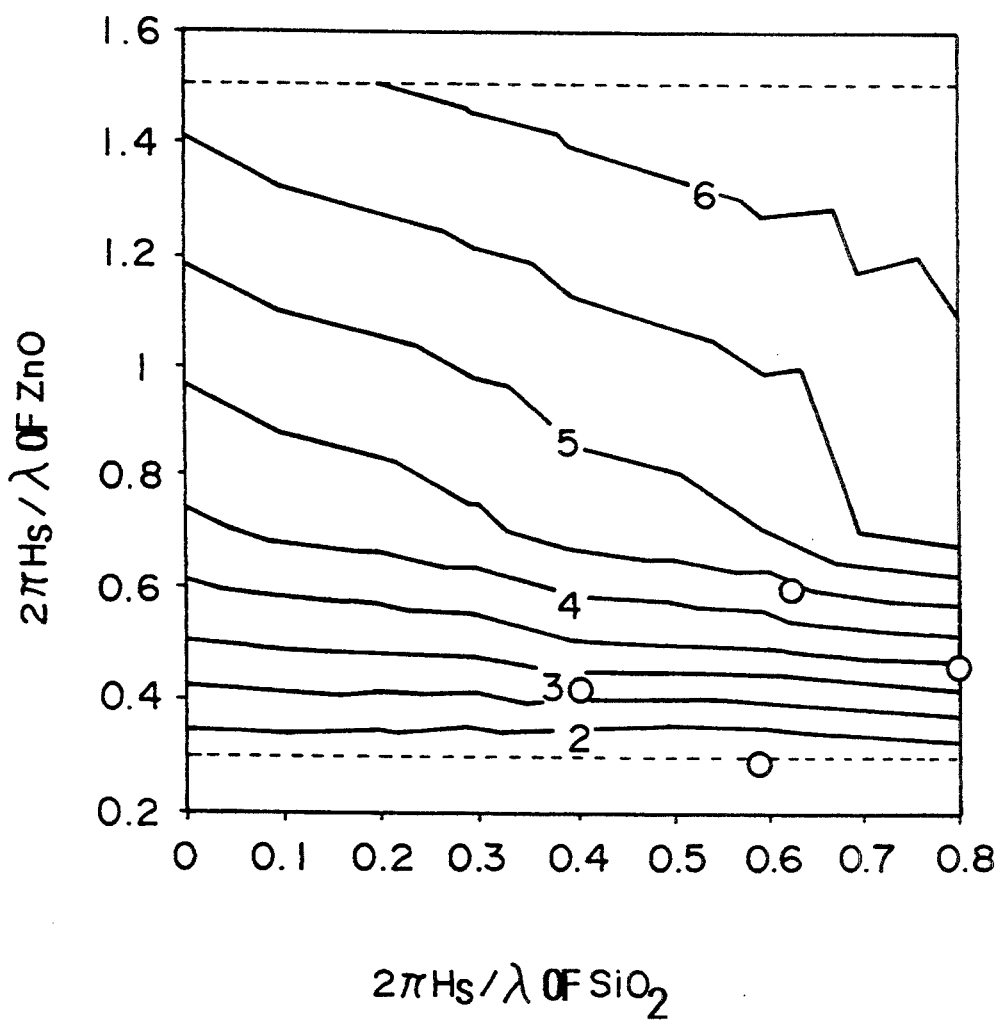
FIG. 17 is a graph showing a relationship between the thicknesses of the $SiO_2$ films and the electro-mechanical coefficient in the surface acoustic wave element of the eighth embodiment.

A surface acoustic wave element was manufactured having the same structure as that of the elements shown in FIG. 4 except only that the thickness of the ZnO thin film and the SiO$_2$ thin film was different. In the manufactured element, the structure of the comb-like electrode is the same type as that of the element of FIG. 13, and both the width of the electrodes and the distance between the electrodes are 2 μm. Further, 2 $\pi$Hd/$\lambda$ in the diamond layer is set to be 4, and the element was formed under the same conditions as in Embodiments 1 to 5. FIG. 17 shows an estimation result of the characteristics in the manufactured element. FIG. 17 is a graph showing the relationship between 2 $\pi$Hz/$\lambda$ and 2 $\pi$Hs/$\lambda$ and electro-mechanical coupling coefficient K$^2$. In FIG. 16, a vertical axis and horizontal axis respectively show 2 $\pi$Hz/$\lambda$ and 2 $\pi$Hs/$\lambda$ and the numbered lines in the graph represent the value of K$^2$.

As shown in FIG. 17, in the element having this structure, the value of electro-mechanical coupling coefficients K$^2$ increases with the increase in the thickness (2 $\pi$Hz/$\lambda$) of the ZnO$_2$ thin film in spite of the thickness (2 $\pi$Hs/$\lambda$) of the SiO$_2$ thin film. Especially when 2 $\pi$Hs/$\lambda \geq =0.4$ and 2 $\pi$Hz/$\lambda \geq 0.65$, the value of K$^2$ in the surface acoustic wave element can reach at least about 5% and when 2 $\pi$Hz/$\lambda \geq 1.2$, the value of K$^2$ in the surface acoustic wave element can reach values not less than about 6%.

In consideration of the propagation velocity of such a surface acoustic wave element and the stability of the element against changes in temperature, a surface acoustic wave element having the ZnO thin film and the SiO$_2$ thin film with thickness corresponding to an area surrounded by 4 circles in FIG. 16 is preferable in practical use. The surface acoustic wave element has a propagation velocity of about 8000–10000 m/s, and a temperature coefficient $\sigma$ of 0±10 ppm/° C. Thus, in the surface acoustic wave element having the SiO$_2$ according to Embodiment 8, the thicknesses of the ZnO thin film or the SiO$_2$ thin film can be selected to realize good characteristics of the element in actual use.

EMBODIMENT 9

Figure 18:
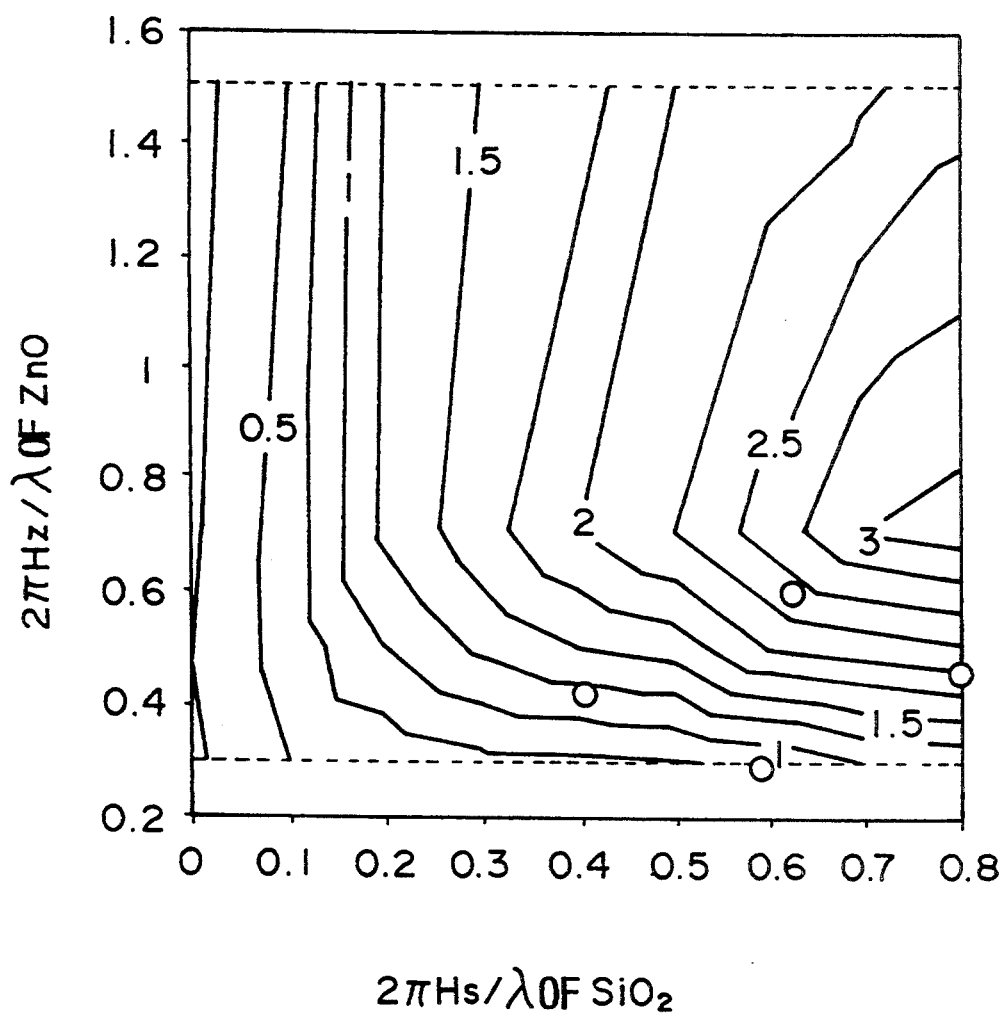
FIG. 18 is a graph showing a relationship between the thicknesses of the $SiO_2$ and ZnO films and the mechanical coefficient in the surface acoustic wave element of the ninth embodiment.

A surface acoustic wave element was manufactured having the same structure as that of the elements shown in FIG. 5 except only that the thickness of the ZnO thin film and the SiO$_2$ thin film was different. In the manufactured element, the structure of the comb-like electrode is the same type as that of the element of FIG. 13, and both the width of the electrodes and the distance between the electrodes are 2 μm. Further, 2 $\pi$Hd/$\lambda$ in the diamond layer is set to be 4, and the element was formed under the same conditions as in Embodiments 1 to 5. FIG. 18 shows an estimation result of the characteristics in the manufactured element. FIG. 18 is a graph showing the relationship between 2 $\pi$Hz/$\lambda$ and 2 $\pi$Hs/$\lambda$ and electro-mechanical coupling coefficients K$^2$. In FIG. 18, a vertical axis and horizontal axis respectively show 2 $\pi$Hz/$\lambda$ and 2 $\pi$Hs/$\lambda$ and numeral in the graph represent the value of K$^2$.

As shown in FIG. 18, in the element having this structure, the value of electro-mechanical coupling coefficient K$^2$ increases with the increase in the thickness (2 $\pi$Hs/$\lambda$) of the SiO$_2$ thin film in spite of the thickness (2 $\pi$Hz/$\lambda$) of the ZnO thin film. Especially when 2 $\pi$Hz/$\lambda \geq =0.4$ and 2 $\pi$Hz/$\lambda \geq =0.65$, the value of K$^2$ in the surface acoustic wave element can reach at least about 2% and when 2 $\pi$Hs/$\lambda$=is about 0.7, then, the value of K$^2$ in the surface acoustic wave element can reach a value not less than 3%.

In consideration of the propagation velocity of such a surface acoustic wave element and the stability of the element against changes in temperature, a surface acoustic wave element having the ZnO thin film and the SiO$_2$ thin film with thickness corresponding to an area surrounded by 4 circles in FIG. 18 is preferable in practical use. The surface acoustic wave element has the propagation velocity of about 8000–10000 m/s, and a temperature coefficient $\sigma$ of 0±10 ppm/° C. Thus, in the surface acoustic wave element having the SiO$_2$ according to Embodiment 9, the thicknesses of the ZnO thin film or the SiO$_2$ thin film can be selected to realize good characteristics of the element in actual use.

EMBODIMENT 10

Figure 19:
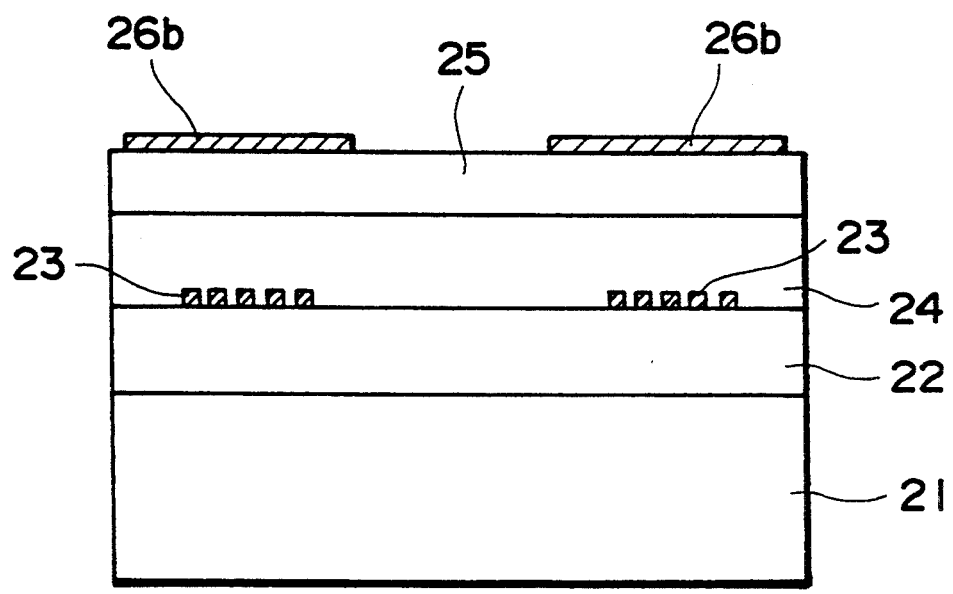
FIG. 19 a sectional view of the surface acoustic wave element according to the tenth embodiment.

An element having a structure shown in FIG. 19 was manufactured. As shown in FIG. 19, a diamond thin film 22 is formed on an Si substrate 21. Comb-like electrodes 23 are formed on the diamond thin film 22, and a ZnO thin film 24 is formed on the comb-like electrodes 23. An SiO$_2$ film 25 is formed on the ZnO film 24. Short-circuiting electrodes 26b are formed on the SiO$_2$ film 25 so as to cover a region in which comb-like electrodes 23 are formed. The structure of the comb-like electrode 23 is the same type as that shown in FIG. 13, and both the width of the electrode and the distance d between the electrodes is 2 μm, and 2 $\pi$Hd/$\lambda$ of the diamond layer is 4. An element having a structure shown in FIG. 19 was manufactured under the same conditions as for the Embodiments 1-9.

Figure 20:
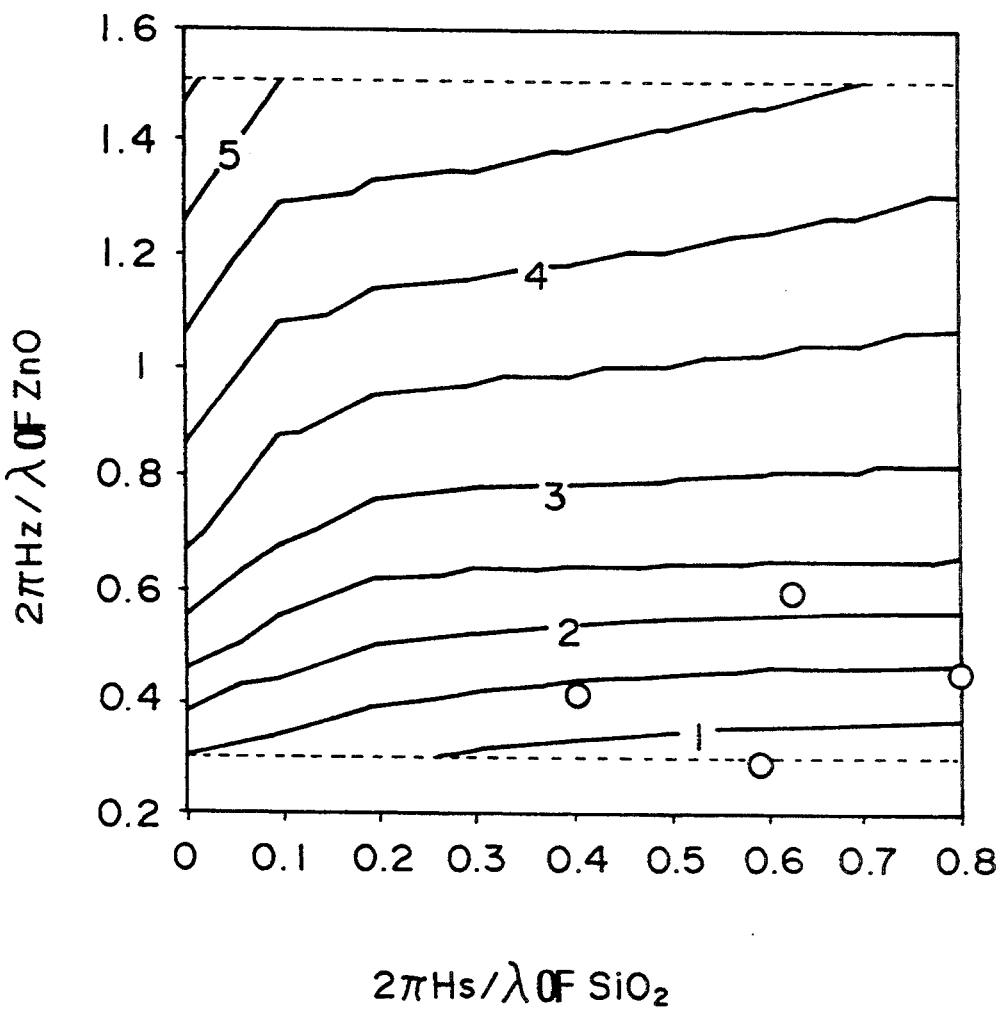
FIG. 20 is a graph showing a relationship between the thicknesses of the $SiO_2$ and ZnO films and the electro-mechanical coefficient in the surface acoustic wave element of the tenth embodiment.

FIG. 20 shows an estimation result of the characteristics in the manufactured element. FIG. 20 is a graph showing the relationship between 2 $\pi$Hz/$\lambda$ and 2 $\pi$Hs/$\lambda$ and electro-mechanical coupling coefficients K$^2$. In FIG. 20, a vertical axis and horizontal axis respectively show 2 $\pi$Hz/$\lambda$ and 2 $\pi$Hs/$\lambda$ and the numbered lines in the graph represent K$^2$.

As shown in FIG. 20, in the element having this structure, the value of electro-mechanical coupling coefficients K$^2$ increases with the increase in the thickness (2 $\pi$Hs/$\lambda$) of the SiO$_2$ thin film in spite of the thickness (2 $\pi$Hz/$\lambda$) of ZnO thin film.

In consideration of the stability of the propagation velocity against changes temperature in such a surface acoustic wave element, a surface acoustic wave element having ZnO thin film and SiO$_2$ thin film with thickness corresponding to an area surrounded by 4 circle in FIG. 20 is preferable in practical use. The surface acoustic wave element has a propagation velocity of about 8000–10000 m/s, and a temperature coefficient $\sigma$ of 0±10 ppm/C. Thus, in a surface acoustic wave element having an SiO$_2$ layer according to the present embodiment 10, the thicknesses of ZnO thin film or SiO$_2$ thin film can be selected to realize good characteristics of the element in actual use.

Thus, in the surface acoustic wave element according to the Embodiments 6 to 10, since a SiO$_2$ thin film is applied, with 0.3$\leq$2 $\pi$Hz/$\lambda \leq$1.0, the element has a propagation velocity not less than 7000 m/s, high electric-mechanical coupling coefficient K$^2$ and high stability at high-temperature.

Besides, in the surface acoustic wave element according to Embodiments 6–10, the thickness of the diamond thin film provided on the Si substrate was about 25 μm. The propagation velocity v increases with the increase in the thickness Hd of the diamond thin film 22, but when $2\pi Hd/\lambda \geq 4.0$, the propagation velocity of the surface acoustic wave does not increase so much. Accordingly, the diamond thin film is sufficiently thick when it has a thickness satisfying $2\pi Hd/\lambda < 4.0$.

Figure 21:
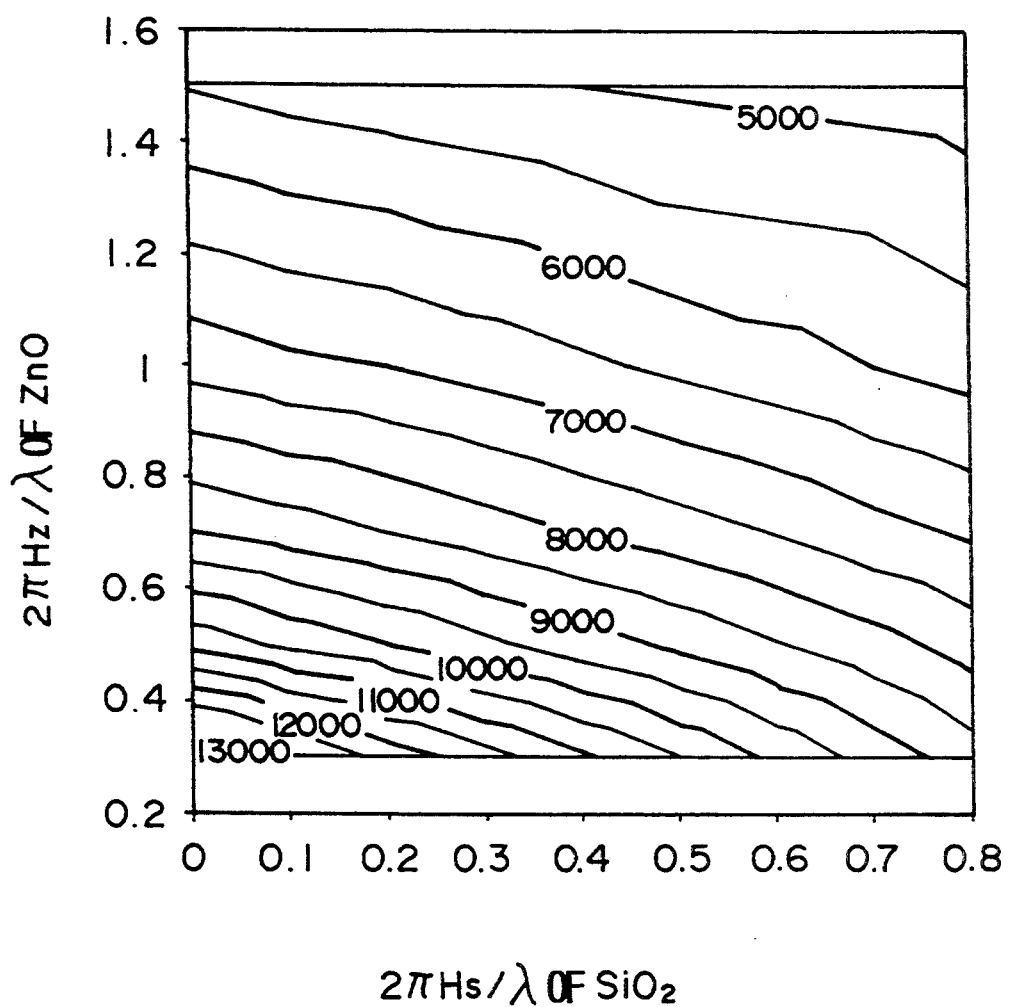
FIG. 21 is a graph showing a relationship between the thicknesses of the $SiO_2$ and ZnO films and the surface wave propagation velocity in the surface acoustic wave elements of the sixth to tenth embodiments.

As described above, in the surface acoustic wave element of the Embodiments 6 to 10, the relationship between $2\pi Hz/\lambda$ and $2\pi Hs/\lambda$ and the propagation velocity v is shown in FIG. 21. In FIG. 21, a vertical axis and horizontal axis respectively show $2\pi Hz/\lambda$ and $2\pi Hs/\lambda$ and the numbered lines in the graph represents the value of v.

As shown in FIG. 21, the propagation velocity v decreases with the increase in $2\pi Hz/\lambda$ and $2\pi Hs/\lambda$, but even if $2\pi Hs/\lambda = 0.8$, when $2\pi Hz/\lambda \leq 0.4$, a propagation velocity not less than 8000 m/s can be obtained in the element.

Further, in the surface acoustic wave element according to the above Embodiments 6 to 10, the relationship between $2\pi Hz/\lambda$ and $2\pi Hs/\lambda$ and temperature coefficient $\sigma$ (ppm/° C.) in a first mode has been investigated. The investigated result is shown in FIG. 22.

Figure 22:
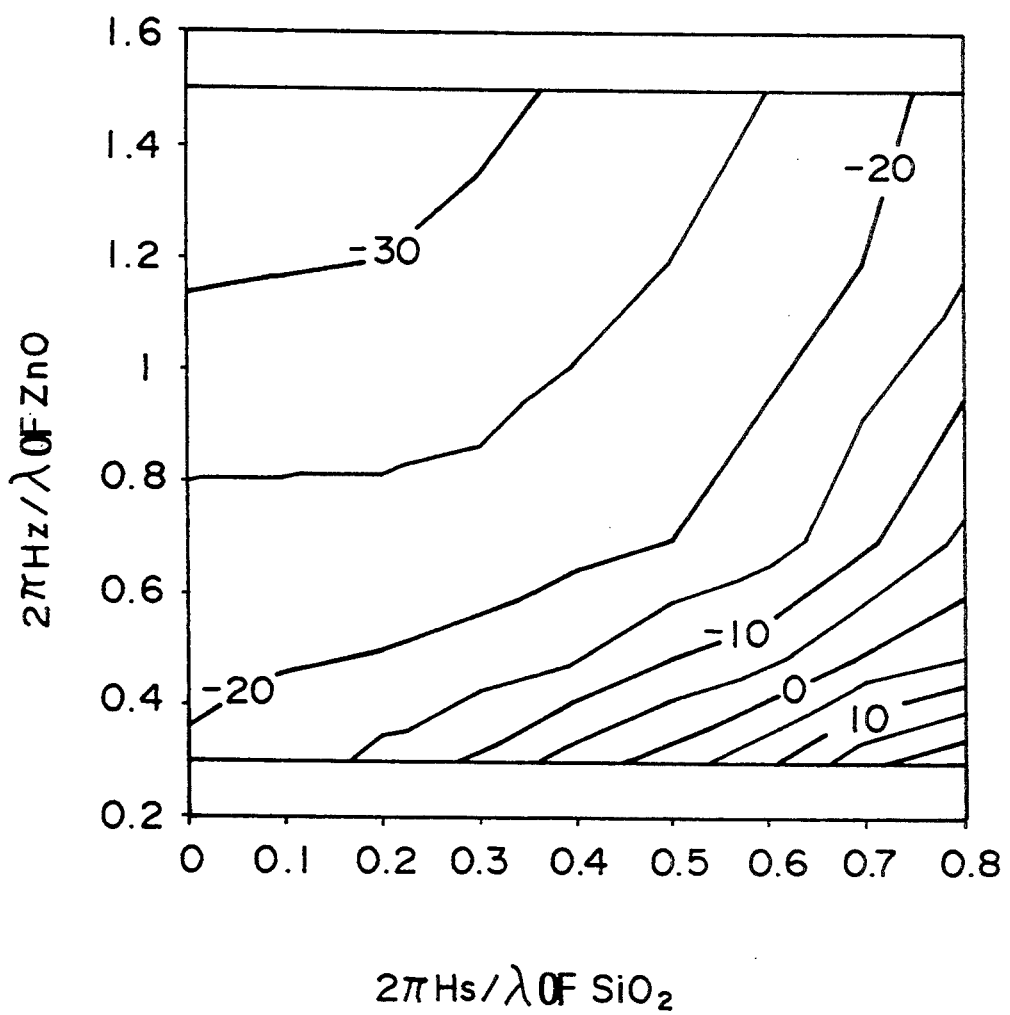
FIG. 22 is a graph showing a relationship between the thicknesses of the $SiO_2$ films and the temperature coefficient in the surface acoustic wave elements of the sixth to tenth embodiments.

As shown in FIG. 22, in spite of the value of $2\pi Hz/\lambda$, the temperature coefficient $\sigma$ increases with the increase in $2\pi Hs/\lambda$, and when $2\pi Hs/\lambda$ falls within the range of 0.5 to 0.8, it is possible to realize $\sigma = 0$, by setting $2\pi Hz/\lambda$ to be a proper value not larger than 0.6. From the above result, in consideration of the electro-mechanical coupling coefficient $K^2$, the propagation velocity v and the temperature coefficient $\sigma$, it is understood that the effective range of $2\pi Hz/\lambda$ and $2\pi Hs/\lambda$ in actual use are respectively 0.4 to 0.8 and 0.2 and 0.6.

In the above surface acoustic wave element according to Embodiments 6 to 10, by setting $2\pi Hs/\lambda$ of the thickness of SiO$_2$ layer 25 to fall within the range of 0.2 to 0.8, an element having the first mode oscillation structure can be realized.

In each of these embodiments described above, a surface acoustic wave element can be used as a high-frequency filter in communication equipment such as a mobile or portable telephone.

In each of these embodiments described above, the standard comb-like electrodes shown in FIG. 12 can be used, but comb-like elements having another shape shown in FIG. 13 or any other shape can be used to obtain the same effect as described above.

From the invention thus described, it will be apparent that the invention may be varied in many ways. Such variations are not to be regarded as a departure from the spirit and scope of the invention, and all such modifications as would be obvious to one skilled in the art are intended to be included within the scope of the following claims.

What is claimed is:

1. A surface acoustic wave element comprising: a hard layer essentially consisting of diamond; a piezoelectric layer formed directly on said hard layer; a silicon dioxide layer formed directly on said piezoelectric layer; and an electrode group sandwiched between said hard layer and said piezoelectric layer or between said piezoelectric layer and said silicon dioxide layer, for performing electro-mechanical conversion; wherein said piezoelectric layer essentially consists of ZnO, and said hard layer has a thickness Hd such that $3 < 2\pi Hd/\lambda$, where $\lambda$ denotes a wavelength of said acoustic wave element in the first-order mode.

2. The surface acoustic wave element of claim 1, wherein said piezoelectric layer has a thickness Hz such that $0.3 < 2\pi Hz/\lambda$, and said silicon dioxide layer has a thickness Hs such that $0.4 < 2\pi Hs/\lambda < 0.8$, where $\lambda$ denotes a wavelength of said acoustic wave element in the first-order mode.

3. The surface acoustic wave element of claim 1, wherein said piezoelectric layer has a thickness Hz such that $2\pi Hz/\lambda < 0.8$, where $\lambda$ denotes a wavelength of said acoustic wave element in the first-order mode.

4. The surface acoustic wave element of claim 1, wherein said silicon dioxide layer has a thickness Hs such that $0.2 \leq 2\pi Hz/\lambda \leq 0.6$, where $\lambda$ denotes a wavelength of said acoustic wave element in the first-order mode.

5. A surface acoustic wave element comprising: a hard layer essentially consisting of diamond; a piezoelectric layer formed directly on said hard layer; a silicon dioxide layer formed directly on said piezoelectric layer; and an electrode group sandwiched between said hard layer and said piezoelectric layer or between said piezoelectric layer and said silicon dioxide layer, for performing electro-mechanical conversion; wherein said piezoelectric layer essentially consists of ZnO and has a thickness Hz, and said silicon dioxide layer has a thickness Hs, such that the ratios $2\pi Hz/\lambda$ and $2\pi Hz/\lambda$, where $\lambda$ denotes a wavelength of said acoustic wave element in the first-order mode, are in a range wherein a propagation velocity v of said acoustic wave element is between about 8,000 m/s and about 10,000 m/s and a temperature coefficient $\sigma$ of said acoustic wave element is about $0 \pm 10$ ppm/° C.

6. A surface acoustic wave element comprising: a hard layer essentially consisting of diamond-like carbon film; a piezoelectric layer formed directly on said hard layer; a silicon dioxide layer formed directly on said piezoelectric layer; and an electrode group sandwiched between said hard layer and said piezoelectric layer or between said piezoelectric layer and said silicon dioxide layer, for performing electro-mechanical conversion; wherein said piezoelectric layer essentially consists of ZnO, and said hard layer has a thickness Hd such that $3 < 2\pi Hd/\lambda$, where $\lambda$ denotes a wavelength of said acoustic wave element in the first-order mode.

7. The surface acoustic wave element of claim 6, wherein said piezoelectric layer has a thickness Hz such that $0.3 < 2\pi Hz/\lambda$, and said silicon dioxide layer has a thickness Hs such that $0.4 < 2\pi Hs/\lambda < 0.8$, where $\lambda$ denotes a wavelength of said acoustic wave element in the first-order mode.

8. The surface acoustic wave element of claim 6, wherein said piezoelectric layer has a thickness Hz such that $2\pi Hz/\lambda < 0.8$, where $\lambda$ denotes a wavelength of said acoustic wave element in the first-order mode.

9. The surface acoustic wave element of claim 6, wherein said silicon dioxide layer has a thickness Hs such that $0.2 \leq 2\pi Hz/\lambda \leq 0.6$, where $\lambda$ denotes a wavelength of said acoustic wave element in the first-order mode.

10. A surface acoustic wave element comprising: a hard layer essentially consisting of diamond-like carbon film; a piezoelectric layer formed directly on said hard layer; a silicon dioxide layer formed directly on said piezoelectric layer; and an electrode group sandwiched between said hard layer and said piezoelectric layer or between said piezoelectric layer and said silicon dioxide layer, for performing electro-mechanical conversion; wherein said piezoelectric layer essentially consists of ZnO and has a thickness Hz, and said silicon dioxide layer has a thickness Hs, such that the ratios $2\pi Hz/\lambda$ and $2\pi Hz/\lambda$, where $\lambda$ denotes a wavelength of said acoustic wave element in the first-order mode, are in a range wherein a propagation velocity v of said acoustic wave element is between about 8,000 m/s and about 10,000 m/s and a temperature coefficient $\sigma$ of said acoustic wave element is about $0\pm10$ ppm/° C.

11. A surface acoustic wave element comprising: a hard layer essentially consisting of diamond and a diamond-like carbon film; a piezoelectric layer formed directly on said hard layer; a silicon dioxide layer formed directly on said piezoelectric layer; and an electrode group sandwiched between said hard layer and said piezoelectric layer or between said piezoelectric layer and said silicon dioxide layer, for performing electro-mechanical conversion; wherein said piezoelectric layer essentially consists of ZnO, and said hard layer has a thickness Hd such that $3<2\pi Hd/\lambda$, where $\lambda$ denotes a wavelength of said acoustic wave element in the first-order mode.

12. The surface acoustic wave element of claim 11, wherein said piezoelectric layer has a thickness Hz such that $0.3<2\pi Hz/\lambda$, and said silicon dioxide layer has a thickness Hs such that $0.4<2\pi Hs/\lambda<0.8$, where $\lambda$ denotes a wavelength of said acoustic wave element in the first-order mode.

13. The surface acoustic wave element of claim 11, wherein said piezoelectric layer has a thickness Hz such that $2\pi Hz/\lambda<0.8$, where $\lambda$ denotes a wavelength of said acoustic wave element in the first-order mode.

14. The surface acoustic wave element of claim 11, wherein said silicon dioxide layer has a thickness Hs such that $0.2\leq2\pi Hs/\lambda\leq0.6$, where $\lambda$ denotes a wavelength of said acoustic wave element in the first-order mode.

15. A surface acoustic wave element comprising: a hard layer essentially consisting of diamond and a diamond-like carbon film; a piezoelectric layer formed directly on said hard layer; a silicon dioxide layer formed directly on said piezoelectric layer; and an electrode group sandwiched between said hard layer and said piezoelectric layer or between said piezoelectric layer and said silicon dioxide layer, for performing electro-mechanical conversion; wherein said piezoelectric layer essentially consists of ZnO and has a thickness Hz, and said silicon dioxide layer has a thickness Hs, such that the ratios $2\pi Hz/\lambda$ and $2\pi Hs/\lambda$, where $\lambda$ denotes a wavelength of said acoustic wave element in the first-order mode, are in a range wherein a propagation velocity v of said acoustic wave element is between about 8,000 m/s and about 10,000 m/s and a temperature coefficient $\sigma$ of said acoustic wave element is about $0\pm10$ ppm/° C.

* * * * *

UNITED STATES PATENT AND TRADEMARK OFFICE
CERTIFICATE OF CORRECTION

PATENT NO. : 5,446,329

DATED : August 29, 1995

INVENTOR(S) : Nakahata et al

It is certified that error appears in the above-indentified patent and that said Letters Patent is hereby corrected as shown below:

On the title page: Item [56]

In "FOREIGN PATENT DOCUMENTS", line 5, replace "0149019" by --0149109--.

Col. 2, line 47, delete "in";
line 62, delete "that", after "and" insert --that--.

Col. 3, line 1, replace "has" by --includes--;
line 6, replace "change" (first occurrence) by --coefficient--;

Col. 7, line 38, replace "which" by --that--.

Col. 8, line 24, replace "the" by --a--;
line 29, replace "the" (first occurrence) by --a--;
line 30, replace "a" by --the--;
line 54, replace "FUJIWARAY.," by --FUJIWARA Y.,--;
line 59, after "element" insert --,--.

Col. 9, line 15, delete "that of";
line 16, replace "and which has a" by --.--;
line 17, delete "higher center frequency.".

UNITED STATES PATENT AND TRADEMARK OFFICE
CERTIFICATE OF CORRECTION

PATENT NO. : 5,446,329

DATED : August 29, 1995

INVENTOR(S) : Nakahata et al

Page 2 of 3

It is certified that error appears in the above-indentified patent and that said Letters Patent is hereby corrected as shown below:

Col. 9, line 18, delete "dioxide";

line 31, replace "to" by --the--.

Col. 12, line 21, after "non-or" insert --zero-dimensional--;

line 36, replace "HZ" by --Hz--;

line 40, replace "K$^s$" by --K$^2$--;

line 43, replace "Hz" (first occurrence) by --Hs--;

line 58, replace "Hz" (first occurrence) by --Hs--.

Col. 13, line 28, replace ">" by --$\geq$--.

Col. 14, line 16, replace "changes in" by --the--;

line 54, replace "=" by --$\approx <$--.

Col. 15, line 25, delete "=" (second occurrence);

line 34, replace "thickness" by --thicknesses--;

line 60, replace "numeral" by --the numbered lines--;

line 67, replace "Hz" (first occurrence) by --Hs--, delete "=" (Second and fourth occurrences).

UNITED STATES PATENT AND TRADEMARK OFFICE
CERTIFICATE OF CORRECTION

PATENT NO. : 5,446,329
DATED : August 29, 1995
INVENTOR(S) : Nakahata et al

It is certified that error appears in the above-indentified patent and that said Letters Patent is hereby corrected as shown below:

```
Col. 16, line 49, replace "thickness" by --thicknesses--;
         line 55, replace "embodi-" by --Embodi---;
         line 60, replace "a" by --an--.
Col. 18, line 25, replace "Hz" by --Hs--;
         line 55, replace "Hz" by --Hs--.
Col. 19, line  1, replace "Hz" by --Hs--.
```

Signed and Sealed this

Sixteenth Day of January, 1996

Attest:

BRUCE LEHMAN

Attesting Officer

Commissioner of Patents and Trademarks